United States Patent
Uno et al.

(10) Patent No.: US 12,313,689 B2
(45) Date of Patent: May 27, 2025

(54) DIAGNOSIS METHOD, DIAGNOSIS APPARATUS, AND DIAGNOSIS SYSTEM OF BATTERY, AND NON- TRANSITORY STORAGE MEDIUM

(71) Applicant: KABUSHIKI KAISHA TOSHIBA, Tokyo (JP)

(72) Inventors: Wataru Uno, Kanagawa (JP); Yuta Kanai, Kanagawa (JP); Ryosuke Yagi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 18/170,579

(22) Filed: Feb. 17, 2023

(65) Prior Publication Data

US 2024/0012060 A1    Jan. 11, 2024

(30) Foreign Application Priority Data

Jul. 11, 2022    (JP) .................................. 2022-111390

(51) Int. Cl.
  *G01R 31/389*    (2019.01)
  *G01R 31/3842*   (2019.01)
  *G01R 31/392*    (2019.01)

(52) U.S. Cl.
  CPC ....... *G01R 31/389* (2019.01); *G01R 31/3842* (2019.01); *G01R 31/392* (2019.01)

(58) Field of Classification Search
  CPC .......................... G01R 31/3842; G01R 31/389; G01R 31/392; Y02E 60/10
  See application file for complete search history.

(56) References Cited

U.S. PATENT DOCUMENTS

| 10,256,512 B2 | 4/2019 | Sun et al. |
| 2013/0103224 A1 | 4/2013 | Egami et al. |
| 2018/0222344 A1* | 8/2018 | Oguma .................... B60L 58/12 |

FOREIGN PATENT DOCUMENTS

| JP | 2013-093120 A | 5/2013 |
| JP | 2019-021608 A | 2/2019 |
| WO | 2023095263 A1 | 6/2023 |
| WO | 2023100241 A1 | 6/2023 |

OTHER PUBLICATIONS

J.P. Schmidt et al., "Studies on LiFePO4 as cathode material using impedance spectroscopy", Journal of Power Sources, vol. 196, Issue 12, pp. 5342-5348, Jun. 15, 2011.

* cited by examiner

*Primary Examiner* — Alesa Allgood
*Assistant Examiner* — Courtney G McDonnough
(74) *Attorney, Agent, or Firm* — Maier & Maier, PLLC

(57) ABSTRACT

In a diagnosis method of a battery of an embodiment, based on a measurement result of a first impedance of a battery at a first frequency, it is determined, for each of a plurality of SOC values, whether an absolute value of a change ratio of the first impedance to the SOC is not more than a reference value. In the diagnosis method, for a target SOC value whose absolute value of the change ratio is not more than the reference value in the plurality of SOC values, a second impedance of the battery at a second frequency higher than the first frequency is measured. In the diagnosis method, determination concerning the state of the battery is performed based on the measurement results of the first impedance and the second impedance for the target SOC value.

14 Claims, 8 Drawing Sheets

DIAGNOSIS METHOD, DIAGNOSIS APPARATUS, AND DIAGNOSIS SYSTEM OF BATTERY, AND NON- TRANSITORY STORAGE MEDIUM

CROSS-REFERENCE TO RELATED APPLICATIONS

This application is based upon and claims the benefit of priority from Japanese Patent Application No. 2022-111390, filed Jul. 11, 2022; the entire contents of which are incorporated herein by reference.

FIELD

Embodiments described herein relate generally to a diagnosis method, a diagnosis apparatus, and a diagnosis system of a battery, and a non-transitory storage medium.

BACKGROUND

In recent years, concerning a battery such as a secondary battery, the frequency characteristic of the impedance of the battery is measured, and the state of the battery including the degradation state of the battery is diagnosed based on the measurement result of the frequency characteristic of the impedance. In such a diagnosis, a current waveform such as the current waveform of an AC current, whose current value periodically changes, is input to the battery at each of a plurality of frequencies, and the impedance of the battery is measured at each of the plurality of frequencies, thereby measuring the frequency characteristic of the impedance of the battery. The frequency characteristic of the impedance is measured for each of a plurality of SOC values of the battery. For each of the plurality of SOC values for which the frequency characteristic of the impedance is measured, a resistance concerning each of a positive electrode and a negative electrode is calculated using the measurement result of the frequency characteristic of the impedance, and, for example, the charge transfer resistance of at least one of the positive electrode and the negative electrode is calculated. Then, the state of the battery such as the degradation state of the battery is determined based on the resistance calculated for each of the plurality of SOC values, the relationship between the calculated resistance and the SOC of the battery, and the like.

When making a diagnosis of the state of the battery in the above-described way, it is necessary to suppress an increase of the amount of data used to determine the state of the battery by, for example, decreasing the number of SOC values for measuring the impedance at high frequencies. In addition, even if the amount of data used to determine the state of the battery is decreased, it is required to appropriately determine the state of the battery such as the degradation state of the battery based on the measurement result of the frequency characteristic of the impedance.

DETAILED DESCRIPTION

Figure 1:
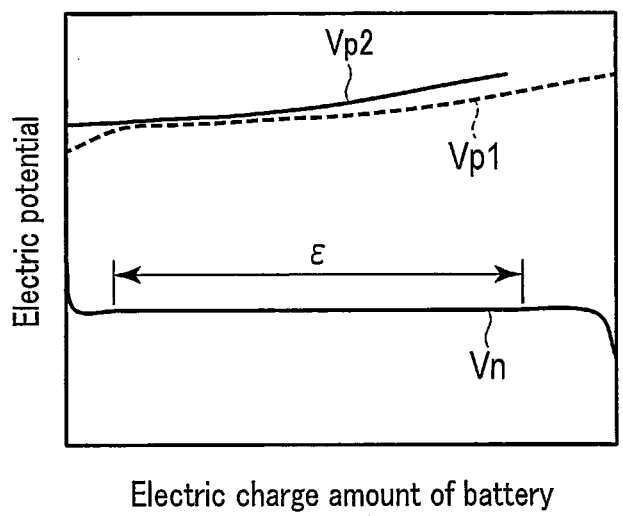
FIG. 1 is a schematic view showing, concerning a battery as a diagnosis target in the embodiment, an example of the relationship between the charging state of the battery and the electric potential of each of a positive electrode and a negative electrode.

In a diagnosis method of a battery according to the embodiment, based on the measurement result of a first impedance that is the impedance of a battery at a first frequency, it is determined, for each of a plurality of SOC values of the battery, whether the absolute value of the change ratio of the first impedance to the SOC of the battery is equal to or smaller than a reference value. In the diagnosis method, for a target SOC value whose absolute value of the change ratio is equal to or smaller than the reference value in the plurality of SOC values, a second impedance that is the impedance of the battery at a second frequency higher than the first frequency is measured in addition to the first impedance. In the diagnosis method, determination concerning the state of the battery is performed based on the measurement results of the first impedance and the second impedance for the target SOC value.

The embodiment will be described below with reference to the accompanying drawings.

EMBODIMENT

A battery as a diagnosis target in this embodiment will be described first. The battery as the diagnosis target is, for example, a secondary battery such as a lithium ion secondary battery, a lead storage battery, or a nickel hydrogen battery. The battery may be formed by a unit cell (unit battery), or may be a battery module or a cell block formed by electrically connecting a plurality of unit cells. When the battery is formed by a plurality of unit cells, the plurality of unit cells may electrically be connected in series, or may electrically be connected in parallel in the battery. In addition, both a series-connection structure in which a plurality of unit cells are connected in series and a parallel-connection structure in which a plurality of unit cells are connected in parallel may be formed in the battery. Furthermore, the battery may be any one of a battery string, a battery array, and a storage battery, in each of which a plurality of battery modules are electrically connected. Also, in a battery module in which a plurality of unit cells are electrically connected, each of the plurality of unit cells may be diagnosed as a battery of a diagnosis target.

In the battery as described above, the electric charge amount (charging amount) and the SOC are defined as parameters representing the charging state of the battery. The electric charge amount of the battery in real time is calculated based on the electric charge amount of the battery at a predetermined time point and a time change from the predetermined time point concerning a current flowing to the battery. For example, the time integrated value of the current flowing to the battery from the predetermined time point is added to the electric charge amount of the battery at the predetermined time point, thereby calculating the electric charge amount of the battery in real time.

In the battery, for the voltage, a lower limit voltage Vmin and an upper limit voltage Vmax are defined. Also, an SOC value is defined as the value of an SOC of the battery. In the battery, a state in which the voltage in discharging or charging under a predetermined condition becomes the lower limit voltage Vmin is defined as a state in which the SOC value is 0 (0%), and a state in which the voltage in discharging or charging under a predetermined condition becomes the upper limit voltage Vmax is defined as a state in which the SOC value is 1 (100%). Additionally, in the battery, a charging capacity (charging electric charge amount) until the SOC value changes from 0 to 1 in charging under a predetermined condition or a discharging capacity (discharging electric charge amount) until the SOC value changes from 1 to 0 in discharging under a predetermined condition is defined as a battery capacity. The ratio of a remaining electric charge amount (remaining capacity) until the state in which the SOC value is 0 to the battery capacity of the battery is the SOC of the battery.

The battery includes a positive electrode and a negative electrode as electrodes, and the polarities of the positive electrode and the negative electrode are opposite to each other. Each of the positive electrode and the negative electrode of the battery changes its electric potential in correspondence with a change of the charging state. In each of the positive electrode and the negative electrode, a predetermined relationship is held between the electric potential and the charging state. For this reason, for each of the electrodes of the battery, the electric potential can be calculated based on the charging state, and the charging state can be calculated based on the electric potential. In the battery that is a secondary battery, when charging and discharging are repeated, the relationship of the electric potential of each of the electrodes (the positive electrode and the negative electrode) of the battery to the electric charge amount and the SOC of the battery changes as compared to that at the start of use of the battery. In this embodiment, for the battery as the diagnosis target, the relationship of the electric potential of at least one of the positive electrode and the negative electrode to the SOC of the battery in real time is estimated. Then, concerning the relationship of the electric potential of at least one of the positive electrode and the negative electrode to the SOC of the battery, the degradation state or the like is determined for at least one of the positive electrode and the negative electrode by comparing the relationship at the start of use of the battery with the relationship in real time.

FIG. 1 is a schematic view showing, concerning the battery as the diagnosis target in the embodiment, an example of the relationship between the charging state of the battery and the electric potential of each of the positive electrode and the negative electrode. In FIG. 1, the abscissa represents the electric charge amount (charging amount) of the battery, and the ordinate represents the electric potential. FIG. 1 shows relationships Vp1 and Vp2 between the electric charge amount of the battery and the electric potential of the positive electrode and a relationship Vn between the electric charge amount of the battery and the electric potential of the negative electrode. In a battery 5 of the example shown in FIG. 1, when charging and discharging are repeated, the relationship between the electric charge amount of the battery and the electric potential of the positive electrode change from the relationship Vp1 to the relationship Vp2. When compared under conditions that the electric charge amounts of the battery are identical to each other, the electric potential of the positive electrode is higher in the relationship Vp2 than in the relationship Vp1. For this reason, in the example shown in FIG. 1, if the positive electrode degrades, the potential of the positive electrode after the degradation is shifted to the high electric potential side relative to the electric potential of the positive electrode before the degradation when compared under conditions that the electric charge amounts of the battery are identical to each other. Since the relationship between the electric charge amount of the battery and the electric potential of the positive electrode changes as described above, in the example shown in FIG. 1, the relationship between the electric potential of the positive electrode and the SOC of the battery changes from the start of use of the battery.

Also, in the battery as the diagnosis target, one of the positive electrode and the negative electrode is defined as a first electrode, and one of the positive electrode and the negative electrode, which has a polarity opposite to that of the first electrode, is defined as a second electrode. In the battery, the first electrode includes a first electrode active material as an electrode active material, and the second electrode includes a second electrode active material different from the first electrode active material as an electrode active material. If the SOC value of the battery changes within the range of 0 to 1 (0% to 100%), the first electrode active material performs a single-phase reaction (solid-solution reaction) in each of occlusion and release of lithium. If the SOC value of the battery 5 changes within the range of 0 to 1, the second electrode active material may perform a two-phase coexistence reaction or a single-phase reaction in each of occlusion and release of lithium. If the second electrode contains the second electrode active material that performs a two-phase coexistence reaction, the second electrode has a plateau region where the electric potential is constant or almost constant even if the charging state changes. In the example shown in FIG. 1, the negative electrode is the second electrode containing the second electrode active material that performs a two-phase coexistence reaction, and the negative electrode has a plateau region ε.

In an example, the battery as the diagnosis target is a lithium ion secondary battery that is charged and discharged as lithium ions move between the positive electrode and the negative electrode. The first electrode active material of the first electrode performs a single-phase reaction in each of occlusion and release of lithium, and the second electrode active material of the second electrode performs a two-phase coexistence reaction in each of occlusion and release of lithium. If the positive electrode is the first electrode, in the positive electrode, one of lithium nickel cobalt manganese oxide, lithium cobalt oxide, and lithium nickel cobalt aluminum oxide is used as the first electrode active material (positive electrode active material) that performs a single-phase reaction. In the negative electrode serving as the second electrode, one of lithium titanate, titanium oxide, and niobium titanium oxide is used as the second electrode active material (negative electrode active material) that performs a two-phase coexistence reaction. On the other hand, if the negative electrode is the first electrode, in the negative electrode, a carbon-based active material is used as the first electrode active material (negative electrode active material) that performs a single-phase reaction. In the positive electrode serving as the second electrode, one of lithium iron phosphate and lithium manganese oxide is used as the second electrode active material (positive electrode active material) that performs a two-phase coexistence reaction.

In the embodiment, for the battery as the diagnosis target, the relationship between the electric potential of the first electrode and the SOC of the battery in real time is estimated. In the diagnosis of the battery, the relationship between the electric potential of the second electrode and the SOC of the battery may be estimated based on the estimation result of the relationship between the electric potential of the first electrode and the SOC of the battery. When estimating the relationship between the electric potential of the first electrode and the SOC of the battery in real time, the impedance of the battery as the diagnosis target and the frequency characteristic of the impedance are measured. Then, the resistance component of the impedance of the battery is calculated based on the measurement result of the frequency characteristic of the impedance of the battery.

Here, the impedance components of the battery include an ohmic resistance including a resistance in the moving process of lithium in an electrolyte, the charge transfer impedance of each of the positive electrode and the negative electrode, an impedance derived from a coat, including a coat resistance of a coat formed on the positive electrode or the negative electrode by a reaction or the like, a Warburg impedance including a diffusion resistance, and the inductance component of the battery. In each of the positive electrode and the negative electrode, the resistance component of the charge transfer impedance is the charge transfer resistance. The impedance components of the battery, including the charge transfer resistances of the first electrode and the second electrode, can be calculated using the frequency characteristic of the impedance of the battery.

In the embodiment, for the battery as the diagnosis target, the frequency characteristic of the impedance is measured for each of a plurality of target SOC values. For each of the plurality of target SOCs, the charge transfer resistance of the first electrode is calculated as a resistance concerning the first electrode based on the measurement result of the frequency characteristic of the impedance. Thus, the relationship between the charge transfer resistance of the first electrode and the SOC of the battery in real time is calculated. Also, the charge transfer resistance of the first electrode has a predetermined relationship with the electric potential and the charging state of the first electrode. In the embodiment, for the battery as the diagnosis target, the relationship between the electric potential of the first electrode and the SOC of the battery in real time is calculated using the calculation result of the relationship between the charge transfer resistance of the first electrode and the SOC of the battery and the predetermined relationship between the electric potential of the first electrode and the charge transfer resistance of the first electrode. Then, the degradation state of the first electrode is determined based on the calculation result of the relationship between the charge transfer resistance of the first electrode and the SOC of the battery and the calculation result of the relationship between the electric potential of the first electrode and the SOC of the battery.

Figure 2:
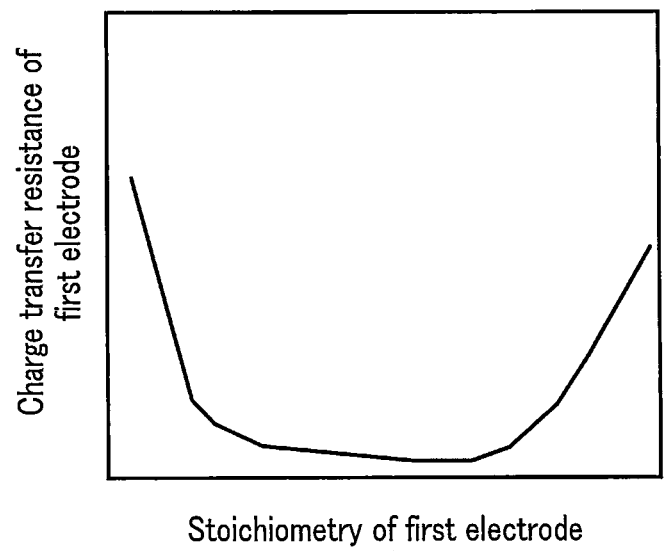
FIG. 2 is a schematic view showing, concerning the battery as the diagnosis target in the embodiment, an example of the relationship between the charging state of a first electrode and the charge transfer resistance of the first electrode.

FIG. 2 is a schematic view showing, concerning the battery as the diagnosis target in the embodiment, an example of the relationship between the charging state of the first electrode and the charge transfer resistance of the first electrode. In FIG. 2, the abscissa represents the stoichiometry of the first electrode as the charging state of the first electrode, and the ordinate represents the charge transfer resistance of the first electrode. In the battery according to the embodiment, the first electrode contains the first electrode active material that performs a single-phase reaction, as described above. Hence, as shown in FIG. 2, if the charging state of the first electrode changes, the charge transfer resistance of the first electrode changes in correspondence with the charging state of the first electrode. The relationship between the stoichiometry of the first electrode and the charge transfer resistance of the first electrode shown in FIG. 2 has a shape projecting to the low charge transfer resistance side (lower side).

Figure 3:
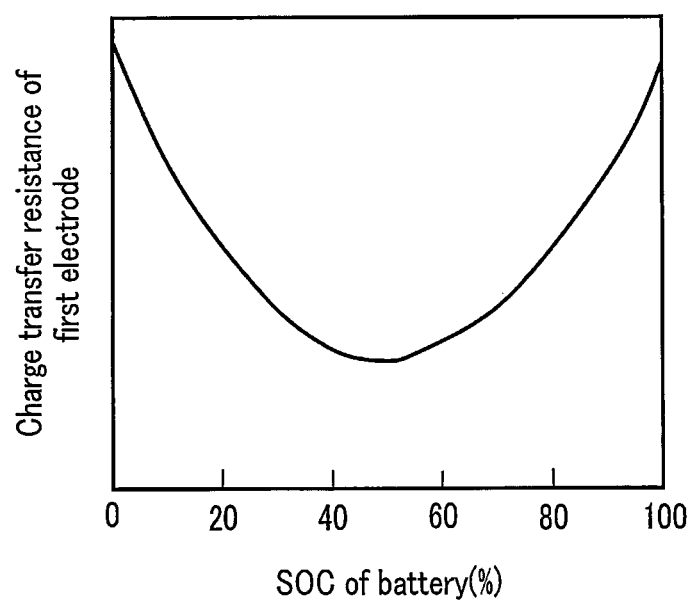
FIG. 3 is a schematic view showing, concerning the battery as the diagnosis target in the embodiment, an example of the relationship between the SOC of the battery and the charge transfer resistance of the first electrode.

FIG. 3 is a schematic view showing, concerning the battery as the diagnosis target in the embodiment, an example of the relationship between the SOC of the battery and the charge transfer resistance of the first electrode. In FIG. 3, the abscissa represents the SOC of the battery, and the ordinate represents the charge transfer resistance of the first electrode. In the battery as the diagnosis target, the relationship between the stoichiometry of the first electrode and the charge transfer resistance of the first electrode has a shape projecting to the low charge transfer resistance side, as shown in FIG. 2. For this reason, the relationship between the SOC of the battery and the charge transfer resistance of the first electrode shown in FIG. 3 also has a shape projecting to the low charge resistance side. In addition, the charge transfer resistance of the first electrode tends to be low within the SOC value range of 30% (inclusive) to 70% (inclusive) as compared to the SOC value range of 20% or less and the SOC value range of 80% or more.

In addition, the change ratio of the charge transfer resistance of the first electrode to the SOC of the battery is defined. For an SOC value that increases the charge transfer resistance along with the increase of the SOC, the change ratio of the charge transfer resistance has a positive value. For an SOC value that lowers the charge transfer resistance along with the increase of the SOC, the change ratio of the charge transfer resistance has a negative value. In the battery, the absolute value of the change ratio of the charge transfer resistance of the first electrode to the SOC is small within the SOC value range of 30% (inclusive) to 70% (inclusive) as compared to the SOC value range of 20% or less and the SOC value range of 80% or more.

In a case where the second electrode active material contained in the second electrode performs a single-phase reaction, the relationship between the charging state of the second electrode and the charge transfer resistance of the second electrode has the same tendency as the relationship between the charging state of the first electrode and the charge transfer resistance of the first electrode shown in FIG. 2, and has a shape projecting to the low charge transfer resistance side. Hence, the relationship between the SOC of the battery and the charge transfer resistance of the second electrode has the same tendency as the relationship between the SOC of the battery and the charge transfer resistance of the first electrode shown in FIG. 3, and has a shape projecting to the low charge transfer resistance side. In a case where the second electrode active material contained in the second electrode performs a two-phase coexistence reaction, even if the charging state of the second electrode changes, the charge transfer resistance of the second electrode is constant or almost constant. Hence, even if the SOC of the battery changes, the charge transfer resistance of the second electrode does not change or rarely changes. In the battery as the diagnosis target, since the charge transfer resistance of each of the first electrode and the second electrode and the SOC of the battery have a relationship as described above, the relationship between the SOC of the battery and the impedance (the absolute value of the impedance) of the battery has the same tendency as the relationship between the SOC of the battery and the charge transfer resistance of the first electrode. That is, the relationship between the SOC of the battery and the impedance of the battery has a shape projecting to the low impedance side. In addition, the impedance of the battery tends to be low within the SOC value range of 30% (inclusive) to 70% (inclusive) as compared to the SOC value range of 20% or less and the SOC value range of 80% or more.

In addition, the change ratio of the impedance of the battery to the SOC of the battery is defined. For an SOC value that increases the impedance along with the increase of the SOC, the change ratio of the impedance has a positive value. For an SOC value that lowers the impedance along with the increase of the SOC, the change ratio of the impedance has a negative value. In the battery, the absolute value of the change ratio of the impedance to the SOC is small within the SOC value range of 30% (inclusive) to 70% (inclusive) as compared to the SOC value range of 20% or less and the SOC value range of 80% or more.

The above-described tendency represented by the relationship between the SOC of the battery and the impedance of the battery is conspicuous in an impedance within a relatively low frequency range of, for example, Hz (inclusive) to 100 Hz (inclusive). The frequency range changes depending on the type or combination of active materials contained in the electrodes. In an example, the positive electrode serves as the first electrode containing, as the positive electrode active material, lithium nickel cobalt manganese oxide that performs a single-phase reaction, and the negative electrode serves as the second electrode containing, as the negative electrode active material, lithium titanate that performs a two-phase coexistence reaction. In this case, the above-described tendency represented by the relationship between the SOC of the battery and the impedance of the battery is particularly conspicuous in an impedance of about 1 Hz. In the embodiment, using the above-described tendency represented by the relationship between the SOC of the battery and the impedance of the battery, it is determined, for each of a plurality of SOC values, whether to measure the impedance of the battery within a relatively high frequency range of 100 Hz (inclusive) to 10 kHz (inclusive).

Figure 4:
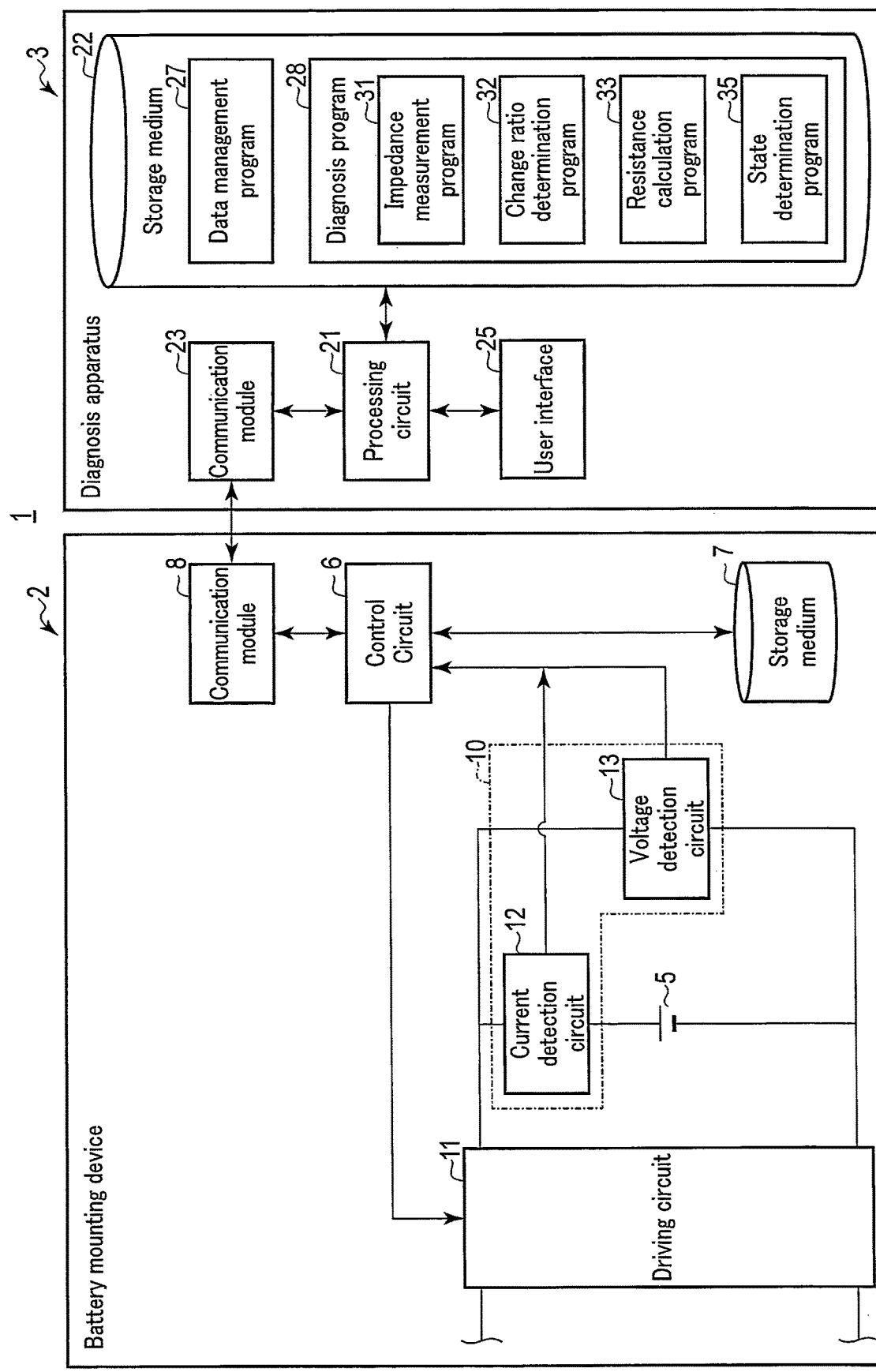
FIG. 4 is a schematic view showing an example of a diagnosis system of a battery according to the embodiment.

A diagnosis system that diagnoses a battery as described above will be described below. FIG. 4 is a schematic view showing an example of a diagnosis system 1 for the battery 5 according to the embodiment. As shown in FIG. 4, the diagnosis system 1 includes a battery mounting device 2 and a diagnosis apparatus 3. The battery 5, a control circuit 6, a storage medium (non-transitory storage medium) 7, and a communication module 8 are mounted in the battery mounting device 2. In addition, a driving circuit 11, a current detection circuit 12, and a voltage detection circuit 13 are mounted in the battery mounting device 2. Examples of the battery mounting device 2 are a large power storage apparatus for an electric power system, a smartphone, a vehicle, a stationary power supply device, a robot, and a drone, and examples of a vehicle serving as the battery mounting device 2 are a railroad vehicle, an electric bus, an electric car, a plug-in hybrid car, and an electric motorcycle. As the battery 5, the above-described battery is used. Hence, the battery 5 includes a first electrode containing a first electrode active material that performs a single-phase reaction, and the relationship between the SOC of the battery and the impedance of the battery exhibits the above-described tendency in an impedance within a relatively low frequency range of 0.1 Hz (inclusive) to 100 Hz (inclusive).

In the battery mounting device 2, a BMU (Battery Management Unit) is formed by the control circuit 6 and the storage medium 7. The control circuit 6 controls charging and discharging of the battery 5, thereby managing the battery 5. The control circuit 6 is formed by a processor or an integrated circuit. The processor or the like forming the control circuit 6 includes one of a CPU (Central Processing Unit), an ASIC (Application Specific Integrated Circuit), a microcomputer, an FPGA (Field Programmable Gate Array), and a DSP (Digital Signal Processor). The control circuit 6 may be formed by one processor or the like, or may be formed by a plurality of processors or the like. The storage medium 7 is one of a main storage device such as a memory and an auxiliary storage device. As the storage medium 7, a magnetic disk, an optical disk (for example, a CD-ROM, a CD-R, or a DVD), a magnetooptical disk (for example, an MO), or a semiconductor memory can be used. The battery mounting device 2 may include only one memory serving as the storage medium 7, or may include a plurality of memories.

The communication module 8 is formed by the communication interface of the battery mounting device 2. The control circuit 6 communicates with a processing apparatus outside the battery mounting device 2, including the diagnosis apparatus 3, via the communication module 8. The control circuit 6 executes a program stored in the storage medium, thereby performing processing. The program to be executed by the control circuit 6 may be stored in a computer (server) connected via a network such as the Internet or a server in a cloud environment. In this case, the control circuit 6 downloads the program via the network. Also, the control circuit 6 performs processing based on an instruction received from the outside via the communication module 8.

The control circuit 6 controls driving of the driving circuit 11, thereby controlling charging and discharging of the battery 5. The control circuit 6, for example, switches the driving state of the driving circuit 11, thereby switching between a state in which the battery 5 is charged and a state in which the battery 5 is discharged. In the state in which the battery 5 is charged, the control circuit 6 controls driving of a electric power supply (not shown) that supplies electric power to the battery 5 and driving of the driving circuit 11, thereby adjusting the magnitude or the like of a current input to the battery 5. Note that the electric power supply that supplies electric power to the battery 5 may be mounted in the battery mounting device 2 or may be provided outside the battery mounting device 2.

The current detection circuit 12 and the voltage detection circuit 13 form a measurement unit 10 that detects and measures parameters associated with the battery 5. In a state in which the battery 5 is charged or discharged, the measurement unit 10 periodically measures the parameters associated with the battery 5. In the measurement unit 10, as the parameters associated with the battery 5, the current detection circuit 12 periodically detects and measures a current flowing to the battery 5, and the voltage detection circuit 13 periodically detects and measures a voltage applied to the battery 5. In an example, the measurement unit 10 includes a temperature sensor (not shown) in addition to the current detection circuit 12 and the voltage detection circuit 13. In this case, as a parameter associated with the battery 5, the temperature sensor periodically detects and measures the temperature of the battery 5.

For the battery 5 as the diagnosis target, the diagnosis apparatus 3 diagnoses the state of the battery 5, including the degradation state of the battery 5. In the example shown in FIG. 4 or the like, the diagnosis apparatus 3 is a processing apparatus (computer) such as a server provided outside the battery mounting device 2, and can communicate with the battery mounting device 2 via a network. The diagnosis apparatus 3 includes a processing circuit 21, a storage medium (non-transitory storage medium) 22, a communication module 23, and a user interface 25. The processing circuit 21 is formed by a processor or an integrated circuit. The processor or the like forming the processing circuit 21 includes one of a CPU, an ASIC, a microcomputer, an FPGA, and a DSP. The processing circuit 21 may be formed by one processor or the like, or may be formed by a plurality of processors or the like. The storage medium 22 is one of a main storage device such as a memory and an auxiliary storage device. The diagnosis apparatus 3 may include only one memory serving as the storage medium 22, or may include a plurality of memories.

The processing circuit 21 performs processing by executing programs and the like stored in the storage medium 22. In the example shown in FIG. 4, as the programs to be executed by the processing circuit 21, a data management program 27 and a diagnosis program 28 are stored in the storage medium 22. The processing circuit 21 executes the data management program 27, thereby performing data write to the storage medium 22 and data read from the storage medium 22. Also, the processing circuit 21 executes the diagnosis program 28, thereby performing processing (to be described later) in diagnosis of the battery 5. The diagnosis program 28 includes an impedance measurement program 31, a change ratio determination program 32, a resistance calculation program 33, and a state determination program 35.

Note that in an example, the diagnosis apparatus 3 is formed by a plurality of processing apparatuses (computers) such as a plurality of servers, and the processors of the plurality of processing apparatuses cooperatively perform processing (to be described later) in the diagnosis of the battery 5. In another example, the diagnosis apparatus 3 is formed by a cloud server in a cloud environment. The infrastructure of the cloud environment is formed by a virtual processor such as a virtual CPU and a cloud memory. Hence, if the diagnosis apparatus 3 is formed by a cloud server, on behalf of the processing circuit 21, the virtual processor performs processing (to be described later) in the diagnosis of the battery 5. The cloud memory has a function of storing programs and data, like the storage medium 22.

In an example, the storage medium 22 that stores the programs to be executed by the processing circuit 21 and data to be used for the processing of the processing circuit 21 is provided in a computer separate from the battery mounting device 2 and the diagnosis apparatus 3. In this case, the diagnosis apparatus 3 is connected, via a network, to the computer in which the storage medium 22 and the like are provided. In another example, the diagnosis apparatus 3 is mounted in the battery mounting device 2. In this case, in the diagnosis apparatus 3, on behalf of the processing circuit 21, a processor or the like mounted in the battery mounting device 2 performs processing (to be described later) in the diagnosis of the battery 5.

The communication module 23 is formed by the communication interface of the processing apparatus that forms the diagnosis apparatus 3. The processing circuit 21 communicates with devices outside the diagnosis apparatus 3, including the battery mounting device 2, via the communication module 23. On the user interface 25, the user of the diagnosis apparatus 3 and the diagnosis system 1, or the like inputs an operation associated with the diagnosis of the battery 5. Hence, the user interface 25 is provided with buttons, a mouse, a touch panel, or a keyboard serving as an operation unit used by the user to input an operation. Also, the user interface 25 is provided with a notification unit that notifies information associated with the diagnosis of the battery 5. The notification unit notifies the information by screen display or sound generation. Note that the user interface 25 may be provided separately from the processing apparatus that forms the diagnosis apparatus 3.

In the embodiment, in the diagnosis of the state of the battery 5, including the degradation state of the battery 5, the following processing is performed by the diagnosis apparatus 3 and the like. The control circuit 6 of the battery mounting device 2 transmits measurement data including the measurement results of the above-described parameters associated with the battery 5 in the measurement unit 10 to the diagnosis apparatus 3 via the communication module 8. The processing circuit 21 of the diagnosis apparatus 3 receives, via the communication module 23, the measurement data transmitted from the battery mounting device 2. Concerning each of the parameters associated with the battery 5, including the current and the voltage of the battery 5, the measurement data received by the processing circuit 21 shows a measurement value at each of a plurality of time points of measurement and a time change (time history). Hence, the measurement data may show the time change (time history) of the current of the battery 5 and the time change (time history) of the voltage of the battery 5, and may show the time change (time history) of the temperature of the battery 5.

At least one of the control circuit 6 of the battery mounting device 2 and the processing circuit 21 of the diagnosis apparatus 3 calculates the electric charge amount (charging amount) and the SOC of the battery 5 in real time based on the measurement data including the measurement results of the parameters associated with the battery 5 in the measurement unit 10. Also, at least one of the control circuit 6 and the processing circuit 21 calculates the time change (time history) of each of the electric charge amount (charging amount) and the SOC of the battery 5 based on the time change (time history) of the parameters associated with the battery 5. The electric charge amount and the SOC of the battery 5 in real time are calculated in the above-described way.

In the diagnosis of the state of the battery 5, the processing circuit 21 executes the diagnosis program 28. The processing circuit 21 executes the impedance measurement program 31 included in the diagnosis program 28, thereby measuring the impedance of the battery 5. When measuring the impedance of the battery 5, the processing circuit 21 transmits an instruction to the control circuit 6 of the battery mounting device 2. The control circuit 6 controls driving of the driving circuit 11 and driving of the electric power supply based on the instruction from the processing circuit 21 and supplies a current with a current waveform with a periodically changing current value to the battery 5. Thus, a current waveform with a periodically changing current value is input to the battery 5.

Figure 5:
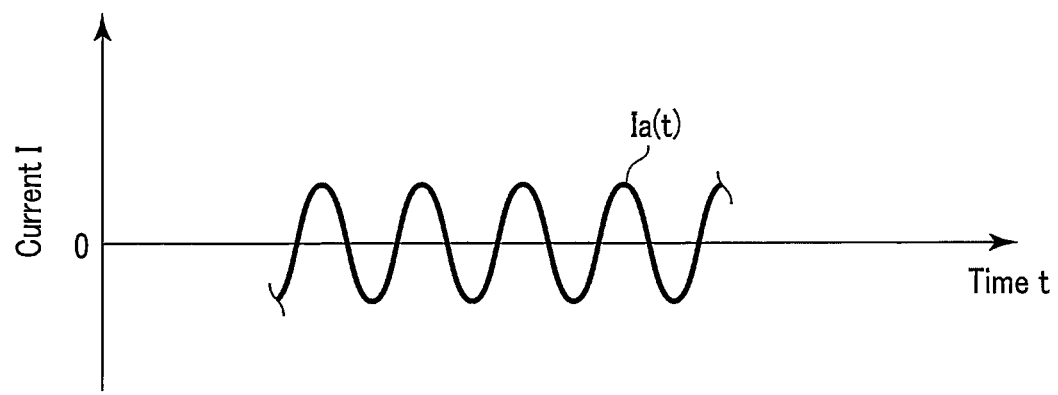
FIG. 5 is a schematic view showing an example of a current waveform input to the battery in measurement of the impedance of the battery according to the embodiment.
Figure 6:
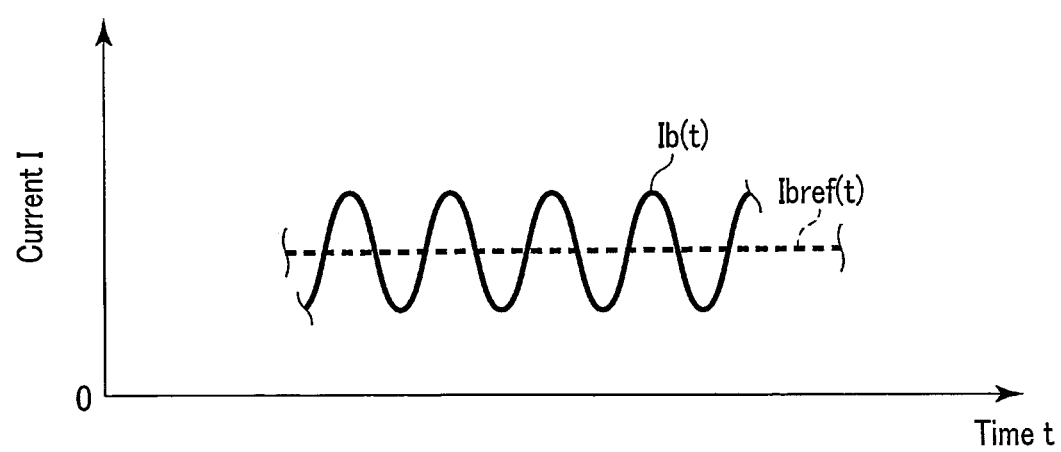
FIG. 6 is a schematic view showing an example, different from FIG. 5, of a current waveform input to the battery in measurement of the impedance of the battery according to the embodiment.

FIG. 5 is a schematic view showing an example of a current waveform input to the battery 5 in measurement of the impedance of the battery 5 according to the embodiment. FIG. 6 is a schematic view showing an example, different from FIG. 5, of a current waveform input to the battery 5 in measurement of the impedance of the battery 5 according to the embodiment. In each of FIGS. 5 and 6, the abscissa represents time t, and the ordinate represents a current I. In each of the example of FIG. 5 and the example of FIG. 6, the impedance of the battery 5 at the frequency of the input current waveform is measured.

In the example of FIG. 5, the control circuit 6 or the like inputs, to the battery 5, an AC current Ia(t) of a current waveform whose flowing direction periodically changes. On the other hand, in the example shown in FIG. 6, a superimposed current Ib(t) generated by superimposing the current waveform of the AC current on a reference current locus Ibref(t) of a DC current is input to the battery 5. In the superimposed current Ib(t) input to the battery 5, the current value periodically changes with respect to the reference current locus Ibref(t) as the center. In addition, the superimposed current Ib(t) is a DC current whose flowing direction does not change. The reference current locus Ibref(t) is, for example, the locus of the time change of a charging current set as a charging condition in charging or the like of the battery 5.

In an example, the impedance of the battery 5 is measured in parallel concurrently with the charging of the battery 5 (the adjustment of the SOC of the battery 5). In this case, like the superimposed current Ib(t) of the example shown in FIG. 6, a superimposed current generated by superimposing the current waveform of the AC current on the reference current locus of a DC current set as the locus of the time change of the charging current is input to the battery 5. The superimposed current is a DC current whose current value periodically changes with respect to the reference current locus in charging as the center. In the reference current locus in charging, the current value of the charging current may be constant over time, or the current value of the charging current may change over time. Also, each of the current waveform of the AC current Ia(t) shown in FIG. 5 and the current waveform of the superimposed current Ib(t) shown in FIG. 6 is a sinusoidal wave (sin wave). However, the current waveform of each of the AC current and the superimposed current may be a current waveform such as a triangular wave or a sawtooth wave other than the sinusoidal wave.

In the measurement unit 10, in a state in which the current waveform with the periodically changing current value is input to the battery 5, as described above, the current detection circuit 12 and the voltage detection circuit 13 measure the current and the voltage of the battery 5 at a plurality of time points, respectively. The control circuit 6 transmits, to the diagnosis apparatus 3 via the communication module 8, measurement data representing the measurement results of the current and the voltage of the battery 5 in the state in which the current waveform with the periodically changing current value is input to the battery 5. The processing circuit 21 receives, via the communication module 23, the measurement data transmitted from the control circuit 6. For the state in which the current waveform with the periodically changing current value is input to the battery 5, the measurement data received by the processing circuit 21 shows the measurement values of the current and the voltage of the battery 5 at each of the plurality of time points of measurement and the time changes (time histories) of the current and the voltage of the battery 5.

The processing circuit 21 executes the impedance measurement program 31, thereby calculating the impedance of the battery 5 at the frequency of the input current waveform based on the measurement data received from the control circuit 6. In an example, the processing circuit 21 calculates a peak-to-peak value (variation width) in the periodical change of the current of the battery 5 based on the time change of the current of the battery 5, and calculates a peak-to-peak value (variation width) in the periodical change of the voltage of the battery 5 based on the time change of the voltage of the battery 5. The processing circuit 21 then calculates the impedance of the battery 5 from the ratio of the peak-to-peak value of the voltage to the peak-to-peak value of the current.

In the diagnosis of the battery 5 as the diagnosis target, first, the processing circuit 21 executes the impedance measurement program 31, thereby measuring a first impedance that is the impedance of the battery 5 at a first frequency for each of a plurality of SOC values of the battery 5. The first impedance for each of the plurality of SOC values is measured in the above-described way. That is, for each of the plurality of SOC values, the processing circuit 21 inputs, to the battery 5, a current waveform whose current value periodically changes at the first frequency, thereby measuring the first impedance.

In an example, the SOC of the battery 5 is adjusted by charging or the like to each of the plurality of SOC values as the measurement target. After that, the same AC current as in the example of FIG. 5 is input to the battery 5 at the first frequency, and the impedance of the battery 5 is measured for each of the plurality of SOC values. In another example, the same superimposed current as in the example of FIG. 6 is input to the battery 5 at the first frequency, and the impedance of the battery 5 is measured for each of the plurality of SOC values while charging the battery 5. In this case, a superimposed current generated by superimposing the current waveform of the AC current on the reference current locus of a DC current at the first frequency is input to the battery 5.

The first frequency is a relatively low frequency, and is a frequency within the frequency range (first frequency range) of 0.1 Hz (inclusive) to 100 Hz (inclusive). Also, in an example, in the battery 5, the positive electrode is the first electrode containing, as the positive electrode active material, lithium nickel cobalt manganese oxide that performs a single-phase reaction, and the negative electrode is the second electrode containing, as the negative electrode active material, lithium titanate that performs a two-phase coexistence reaction. In this case, the first frequency is preferably about 1 Hz.

The measurement result of the first impedance for each of the plurality of SOC values can be shown on, for example, a complex impedance plot (Cole-Cole plot) for the battery 5. On the complex impedance plot, a real number component and an imaginary number component are shown concerning the impedances of the battery 5 including the first impedance for each of the plurality of SOC values. Also, on the complex impedance plot, the distance from the origin indicates the magnitude of the impedance (the absolute value of the impedance). Note that the method of measuring the frequency characteristic of the impedance of the battery by inputting, to the battery, the current waveform with a periodically changing current value and the complex impedance plot are shown in reference literature 1 (J. P. Schmidt et al., "Studies on $LiFePO_4$ as cathode material using impedance spectroscopy" Journal of power Sources. 196, (2011), pp. 5342-5348), or the like.

If the first impedance that is the impedance of the battery 5 at the first frequency is measured for each of the plurality of SOC values as the measurement target, as described above, the processing circuit 21 executes the change ratio determination program 32, thereby calculating a change ratio $\beta$ of the first impedance to the SOC of the battery 5 for each of the plurality of SOC values for which the first impedance is measured. When calculating the change ratio R, the absolute value of the first impedance (the magnitude of the first impedance), that is, the distance from the origin on the complex impedance plot is used as the value of the first impedance for each of the plurality of SOC values. For an SOC value that increases the first impedance along with the increase of the SOC, the change ratio $\beta$ of the first impedance has a positive value. For an SOC value that lowers the first impedance along with the increase of the SOC, the change ratio $\beta$ of the first impedance has a negative value.

Figure 7:
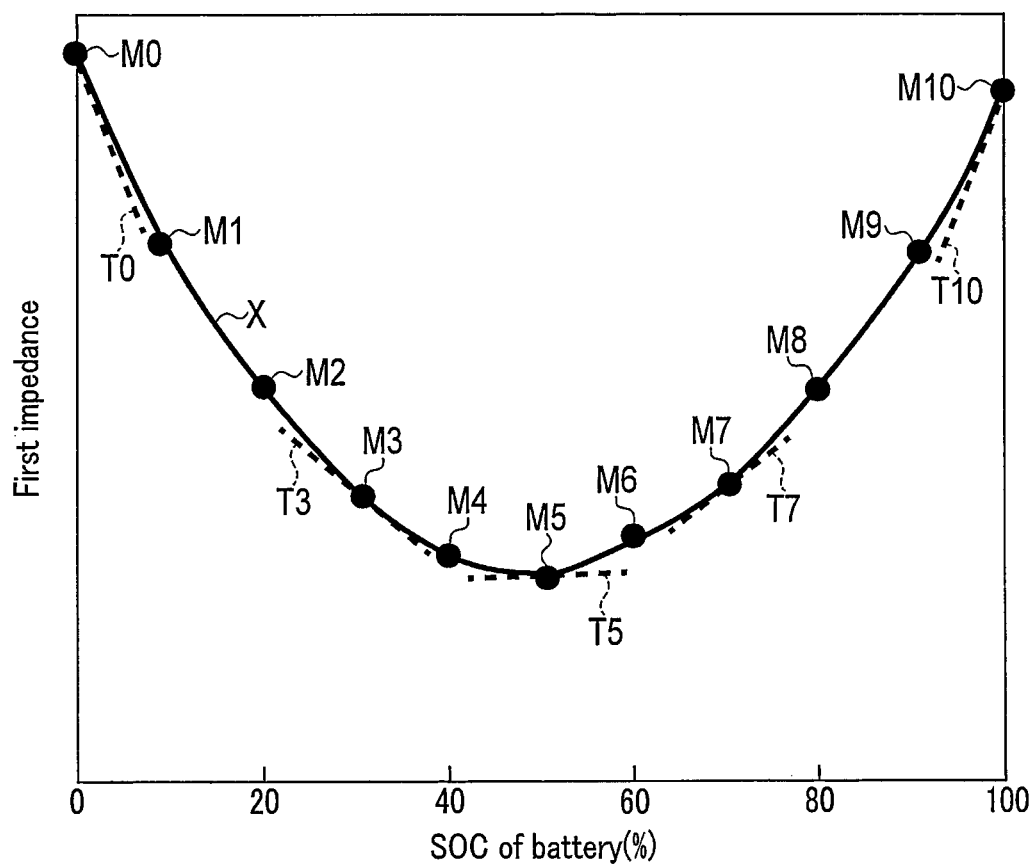
FIG. 7 is a schematic view showing an example of processing of calculating the change ratio of a first impedance to the SOC of the battery for each of a plurality of SOC values in the embodiment.

FIG. 7 is a schematic view showing an example of processing of calculating the change ratio $\beta$ of the first impedance to the SOC of the battery for each of a plurality of SOC values in the embodiment. In FIG. 7, the abscissa represents the SOC of the battery 5, and the ordinate represents the first impedance (the absolute value of the first impedance). In the example shown in FIG. 7, setting 0 (0%) to the lowest SOC value that is lowest and 1 (100%) to the highest SOC value that is highest, the first impedance of the battery 5 is measured at an interval of 0.1 (10%) in SOC conversion of the battery 5. For this reason, the first impedance that is the impedance at the first frequency is measured for each of 11 SOC values. In FIG. 7, the first impedances for the 11 SOC values are plotted as points M0, M1, M2, M3, M4, M5, M6, M7, M8, M9, and M10.

When calculating the change ratio $\beta$ of the first impedance to the SOC for each of the 11 SOC values, the processing circuit 21 calculates a locus X of a function representing the relationship between the SOC and the first impedance of the battery 5 by, for example, a fitting calculation for fitting a function such as a quadratic function or a cubic function to the points M0 to M10. For each of the 11 SOC values, the processing circuit 21 calculates the gradient of a tangent on the locus X as the change ratio $\beta$ of the first impedance to the SOC of the battery 5. For example, the gradients of tangents T0, T3, T5, T7, and T10 are calculated as the change ratios $\beta$ of the first impedances for the SOC values of 0, 0.3, 0.5, 0.7, and 1, respectively. The change ratios $\beta$ of the first impedances for the SOC values of 0.1, 0.2, 0.4, 0.6, 0.8, and 0.9 are similarly calculated from the gradients of tangents on the locus X. Note that when calculating the locus X, interpolation such as spline interpolation may be performed in place of fitting using a function such as a quadratic function.

If the change ratio $\beta$ of the first impedance to the SOC is calculated for each of the plurality of SOC values for which the first impedance is measured in the above-described way, the processing circuit 21 executes the change ratio determination program 32, thereby determining, for each of the plurality of SOC values, whether the absolute value $|\beta|$ of the calculated change ratio $\beta$ is equal to or smaller than a reference value $\beta$ref. The processing circuit 21 then sets an SOC value for which the absolute value $|\beta|$ of the change ratio $\beta$ is equal to or smaller than the reference value $\beta$ref in the plurality of SOC values to a target SOC value as a target to measure the impedance of the battery 5 at a second frequency higher than the first frequency. The reference value $\beta$ref may be a fixed value, or may be set to an appropriate value by the processing circuit 21.

In an example, the reference value $\beta$ref is set based on a change ratio $\beta L$ for the lowest SOC value that is lowest in the plurality of SOC values for which the first impedance is measured or a change ratio $\beta H$ for the highest SOC value that is highest in the plurality of SOC values for which the first impedance is measured. For example, the half value of the absolute value $|\beta L|$ of the change ratio $\beta L$ for the lowest SOC value or the half value of the absolute value $|\beta H|$ of the change ratio $\beta H$ for the highest SOC value is set as the reference value $\beta$ref. In this case, in the example shown in FIG. 7, the half value of the absolute value $|\beta 0|$ of a change ratio $\beta 0$ for an SOC value of 0 or the half value of the absolute value $|\beta 10|$ of a change ratio $\beta 10$ for an SOC value of 1 is set as the reference value $\beta$ref.

Here, since the first frequency is a frequency within the frequency range (first frequency range) of 0.1 Hz (inclusive) to 100 Hz (inclusive), the absolute value $|\beta|$ of the change ratio $\beta$ of the first impedance to the SOC is smaller within the SOC value range of 30% (inclusive) to 70% (inclusive) as compared to the SOC value range of 20% or less and the SOC value range of 80% or more. For this reason, in an example, when determining whether the absolute value $|\beta|$ of the change ratio $\beta$ is equal to or smaller than the reference value $\beta$ref, it is determined that SOC values that fall within the range of 30% (inclusive) to 70% (inclusive) in the plurality of SOC values are target SOC values for which an absolute value $|\beta|$ is equal to or smaller than the reference value $\beta$ref. It is also determined that each SOC values less than 30% and SOC values more than 70% has an absolute value $|\beta|$ larger than the reference value $\beta$ref and is not a target SOC value.

For example, assume that the change ratio $\beta$ of the first impedance to the SOC is calculated for each of the 11 SOC values, like the example shown in FIG. 7. In this case, for each of the SOC values of 0.3, 0.4, 0.5, and 0.7, it is determined that the absolute value $|\beta|$ of the change ratio $\beta$ is equal to or smaller than the reference value $\beta$ref, and it is determined that the SOC value is the target SOC value. On the other hand, for each of the SOC values of 0, 0.1, 0.2, 0.8, 0.9, and 1, it is determined that the absolute value $|\beta|$ of the change ratio $\beta$ is larger than the reference value $\beta$ref, and it is determined that the SOC value is not the target SOC value. Also, in an example, the above-described reference value $\beta$ref may be set to an appropriate value such that only SOC values that fall within the range of 30% (inclusive) to 70% (inclusive) in the plurality of SOC values become the target SOC values. It is preferably determined that two or more of the SOC values for which the first impedance is measured are the target SOC values. It is more preferable to determine that three or more of the SOC values for which the first impedance is measured are the target SOC values.

If each SOC value for which the absolute value |β| of the change ratio β of the first impedance to the SOC is equal to or smaller than the reference value is set to the target SOC value, as described above, for each target SOC value, a second impedance that is the impedance of the battery 5 is measured at the second frequency higher than the first frequency, in addition to the first impedance. In an example, it is determined that only SOC values that fall within the range of 30% (inclusive) to 70% (inclusive) are target SOC values. The processing circuit 21 executes the impedance measurement program 31, thereby measuring the second impedance only for the SOC values that fall within the range of 30% (inclusive) to 70% (inclusive) in the SOC values for which the first impedance is measured.

The second impedance for each of the target SOC values is measured like the first impedance for each of the plurality of SOC values. That is, for each of the target SOC values, the processing circuit 21 inputs, to the battery 5, a current waveform whose current value periodically changes at the second frequency, thereby measuring the second impedance. In an example, the SOC of the battery 5 is adjusted by charging or the like to each of the plurality of target SOC values. After that, the same AC current as in the example of FIG. 5 is input to the battery 5 at the second frequency, and the impedance of the battery 5 is measured for each of the target SOC values. In another example, the same superimposed current as in the example of FIG. 6 is input to the battery 5 at the second frequency, and the impedance of the battery 5 is measured for each of the target SOC values while charging the battery 5. In this case, a superimposed current generated by superimposing the current waveform of the AC current on the reference current locus of a DC current at the second frequency is input to the battery 5.

The second frequency is higher than the first frequency and is a relatively high frequency. Also, the second frequency is a frequency within the frequency range (second frequency range) of 100 Hz (inclusive) to 10 kHz (inclusive). A lower limit frequency within the frequency range (second frequency range) of 100 Hz (inclusive) to 10 kHz (inclusive) in which the second frequency can be included is higher than an upper limit frequency within the frequency range (first frequency range) of 0.1 Hz (inclusive) to 20 Hz (inclusive) in which the first frequency can be included. Also, in an example, in the battery 5, the positive electrode is the first electrode containing, as the positive electrode active material, lithium nickel cobalt manganese oxide that performs a single-phase reaction, and the negative electrode is the second electrode containing, as the negative electrode active material, lithium titanate that performs a two-phase coexistence reaction. In this case, the second frequency is preferably about 1,000 Hz (1 kHz).

If the impedance of the battery 5 is measured as described above, for an SOC value for which the absolute value |β| of the change ratio β of the first impedance is larger than the reference value βref, only the first impedance is measured. On the other hand, for an SOC value for which the absolute value |β| of the change ratio β of the first impedance is equal to or smaller than the reference value βref, both the first impedance and the second impedance are measured, and the impedance at each of a plurality of frequencies is measured. For example, in the example shown in FIG. 7, the first impedance and the second impedance are measured only for the five SOC values of 0.3, 0.5, 0.6, and 0.7 in the 11 SOC values.

In the diagnosis of the battery 5 as the diagnosis target, based on the measurement results of the first impedance and the second impedance for each of the target SOC values, the processing circuit 21 determines the state of the battery 5 such as the degradation state of the battery 5. At this time, the processing circuit 21 executes the resistance calculation program 33, thereby calculating the resistance components of the impedances of the battery for each of the target SOC values for which the first impedance and the second impedance are measured. Then, for each of the target SOC values, the charge transfer resistance of the first electrode, which is one of the impedance resistance components, is calculated as a resistance concerning the first electrode. In addition, for each of the target SOC values, the charge transfer resistance of the second electrode may be calculated in addition to the charge transfer resistance of the first electrode.

The storage medium 22 stores an equivalent circuit model including information about the equivalent circuit of the battery 5. In the equivalent circuit of the equivalent circuit model, a plurality of electric characteristic parameters (circuit constants) corresponding to the impedance components of the battery 5 are set. The electric characteristic parameters are parameters representing the electric characteristics of circuit elements provided in the equivalent circuit. Examples of the electric characteristic parameters are a resistance, a capacitance (capacity), an inductance, and an impedance. If a CPE (Constant Phase Element) is used in place of a capacitor as a circuit element of the equivalent circuit, a capacitance and a Debye experience parameter are set as the electric characteristic parameters of the CPE. The resistance indicated as an electric characteristic parameter in the equivalent circuit includes the charge transfer resistance of the first electrode, and may include the charge transfer resistance of the second electrode.

Also, the equivalent circuit model stored in the storage medium 22 includes data representing the relationship between the electric characteristic parameters of the equivalent circuit and the impedance of the battery 5. The data representing the relationship between the electric characteristic parameters and the impedance of the battery 5 shows, for example, expressions for calculating the real number component and the imaginary number component of the impedance from the electric characteristic parameters (circuit constants). In this case, in the expressions, each of the real number component and the imaginary number component of the impedance of the battery 5 is calculated using the electric characteristic parameters, the frequency, and the like.

Concerning each of the target SOC values for which both the first impedance and the second impedance are measured as the frequency characteristic of the impedance, the processing circuit 21 calculates the charge transfer resistance of the first electrode in the following way using the equivalent circuit model. That is, when calculating the charge transfer resistance of the first electrode for each of the target SOC values, the processing circuit 21 performs a fitting calculation using the equivalent circuit model including the equivalent circuit, and the measurement results of the first impedance and the second impedance. At this time, the fitting calculation is performed using the electric characteristic parameters of the equivalent circuit including the charge transfer resistance of the first electrode as variables, thereby calculating the electric characteristic parameters as the variables. Also, in the fitting calculation, for example, the values of the electric characteristic parameters as the variables are decided such that the difference between the calculation result of the impedance using the expression included in the equivalent circuit model and the measurement result of the impedance becomes as small as possible at each of the first frequency at which the first impedance is measured and the second frequency at which the second impedance is measured.

When the fitting calculation is performed as described above, the charge transfer resistance of the first electrode, which is set as one of the electric characteristic parameters in the equivalent circuit, is calculated. If the charge transfer resistance of the second electrode is set as one of the electric characteristic parameters in the equivalent circuit, the charge transfer resistance of the second electrode is calculated, too. Note that the equivalent circuit of the battery is shown in reference literature 1. Reference literature 1 also shows a method of performing a fitting calculation using the measurement result for the frequency characteristic of the impedance of the battery and the equivalent circuit model of the battery and calculating the electric characteristic parameters (circuit constants) of the equivalent circuit.

Figure 8:
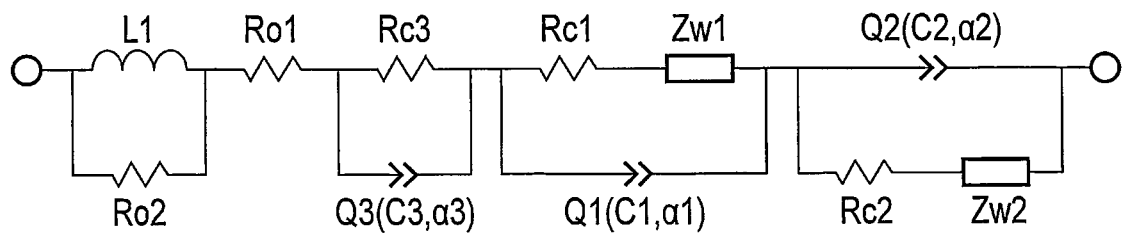
FIG. 8 is a circuit diagram schematically showing an example of the equivalent circuit of a battery used for a fitting calculation in the embodiment.

FIG. 8 is a circuit diagram schematically showing an example of the equivalent circuit of the battery 5 used for a fitting calculation in the embodiment. In the equivalent circuit of the example shown in FIG. 8, resistances Ro1, Ro2, Rc1, Rc2, and Rc3, capacitances C1, C2, and C3, an inductance L1, impedances Zw1 and Zw2, and Debye experience parameters α1, α2, and α3 are set as electric characteristic parameters corresponding to the impedance components of the battery 5. Here, the resistances Ro1 and Ro2 correspond to resistance components serving as ohmic resistances, the inductance L1 corresponds to the inductance component of the battery 5, and the impedances Zw1 and Zw2 correspond to impedance components serving as Warburg impedances. Also, the resistance Rc3 corresponds to the coat resistance of a coat formed on the positive electrode or the negative electrode by a reaction or the like, and the resistance Rc3, the capacitance C3, and the Debye experience parameter α3 correspond to impedances derived from the coat including the coat resistance. The capacitance C3 and the Debye experience parameter α3 are the electric characteristic parameters of a CPE Q3.

Also, in the equivalent circuit of the example shown in FIG. 8, the resistance Rc1, the capacitance C1, and the Debye experience parameter α1 are set as the electric characteristic parameters corresponding to the impedance components of the charge transfer impedance of the first electrode. The capacitance C1 and the Debye experience parameter α1 are the electric characteristic parameters of a CPE Q1. Furthermore, in the equivalent circuit of the example shown in FIG. 8, the resistance Rc2, the capacitance C2, and the Debye experience parameter α2 are set as the electric characteristic parameters corresponding to the impedance components of the charge transfer impedance of the second electrode. The capacitance C2 and the Debye experience parameter α2 are the electric characteristic parameters of a CPE Q2. When the electric characteristic parameters of the equivalent circuit of the example shown in FIG. 8 are calculated by the fitting calculation in the above-described way, the resistance Rc1 is calculated as the charge transfer resistance of the first electrode, and the resistance Rc2 is calculated as the charge transfer resistance of the second electrode.

The processing circuit 21 calculates the charge transfer resistance of the first electrode in the above-described way for each of the plurality of target SOC values for which the first impedance and the second impedance are measured as the frequency characteristic of the impedance. Thus, the relationship between the charge transfer resistance of the first electrode as the resistance concerning the first electrode and the SOC of the battery 5 is calculated. The relationship between the charge transfer resistance of the first electrode and the SOC of the battery 5 is represented by a curve or the like on, for example, a graph with an abscissa representing the SOC of the battery 5 and an ordinate representing the charge transfer resistance of the first electrode. When calculating the curve representing the relationship between the charge transfer resistance and the SOC, a point representing the charge transfer resistance of the first electrode for each of the plurality of target SOC values is plotted on the above-described graph. Then, by a fitting calculation for fitting a function such as a quadratic function or a cubic function to the plotted points, the curve representing the relationship between the charge transfer resistance and the SOC is calculated. Note that when calculating the curve representing the relationship between the charge transfer resistance of the first electrode and the SOC, interpolation such as spline interpolation may be performed in place of fitting using a function.

The processing circuit 21 executes the state determination program 35, thereby calculating the SOC value with which the charge transfer resistance of the first electrode is minimized, as a reference SOC value, using the relationship between the charge transfer resistance of the first electrode and the SOC of the battery 5, which is calculated in the above-described way. The reference SOC value with which the charge transfer resistance of the first electrode is minimized changes from the start of use of the battery 5 because the relationship of the electric potential of the first electrode to the SOC of the battery changes. Hence, by calculating the reference SOC value with which the charge transfer resistance of the first electrode is minimized, the degradation state of the first electrode can be determined, and the state of the battery 5 can be determined. Based on the calculated reference SOC value, the processing circuit 21 determines the state of the battery 5 including the degradation state of the first electrode.

Figure 9:
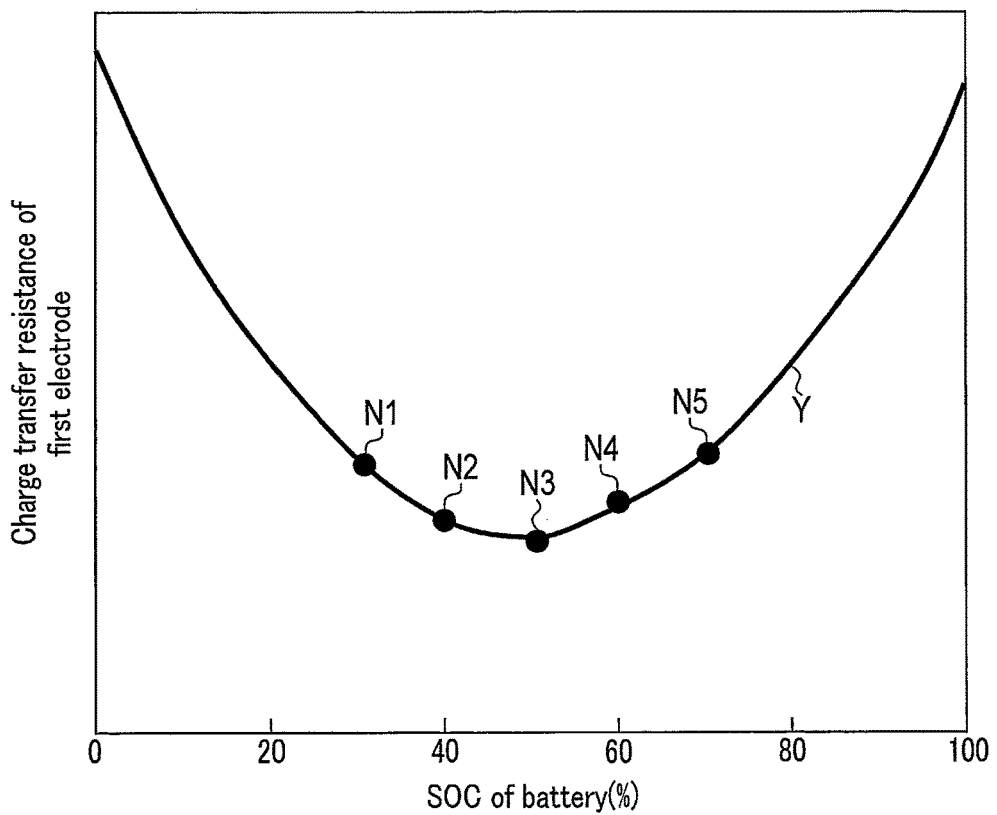
FIG. 9 is a schematic view showing an example of processing of calculating a reference SOC value with which the charge transfer resistance of the first electrode is minimized in the embodiment.

FIG. 9 is a schematic view showing an example of processing of calculating the reference SOC value with which the charge transfer resistance of the first electrode is minimized in the embodiment. In FIG. 9, the abscissa represents the SOC of the battery 5, and the ordinate represents the charge transfer resistance of the first electrode. In the example shown in FIG. 9, each of five SOC values of 0.3, 0.4, 0.5, 0.6, and 0.7 in the plurality of SOC values for which the first impedance is measured is determined as a target SOC value for which the absolute value |β| of the above-described change ratio β is equal to or smaller than the reference value βref. Then, the second impedance is measured for each of the five target SOC values, and the charge transfer resistance of the first electrode is calculated in the above-described way based on the measurement results of the first impedance and the second impedance. In FIG. 9, the charge transfer resistances of the first electrode for the five target SOC values are plotted as points N1, N2, N3, N4, and N5. By a fitting calculation for fitting a function to the points N1 to N5, a locus Y of a function representing the relationship between the SOC of the battery 5 and the charge transfer resistance of the first electrode is calculated.

As indicated by the locus Y of the example shown in FIG. 9, the locus representing the relationship between the charge transfer resistance of the first electrode and the SOC of the battery 5 has a shape projecting to the low charge transfer resistance side (the lower side). The SOC value at the top of the projecting shape on the locus representing the relationship between the charge transfer resistance of the first electrode and the SOC of the battery 5 is calculated as the reference SOC value with which the charge transfer resistance of the first electrode is minimized. In the example shown in FIG. 9, at the top of the projecting shape of the locus Y, the SOC value is 0.5 (50%), and 0.5 is calculated as the reference SOC value with which the charge transfer resistance of the first electrode is minimized.

Also, by executing the state determination program 35, the processing circuit 21 may calculate the relationship between the electric potential of the first electrode and the SOC of the battery 5 in real time based on the relationship between the charge transfer resistance of the first electrode and the SOC of the battery 5. In this case, the storage medium 22 stores data representing a predetermined relationship between the electric potential of the first electrode and the charge transfer resistance of the first electrode. Based on the calculation result concerning the relationship between the charge transfer resistance of the first electrode and the SOC of the battery 5 and the predetermined relationship between the electric potential and the charge transfer resistance of the first electrode, the processing circuit 21 calculates the relationship between the electric potential of the first electrode and the SOC of the battery 5 in real time. At this time, for example, the corresponding value of the electric potential of the first electrode is calculated for each of the plurality of SOC values including the target SOC values for which the second impedance is measured, thereby calculating the relationship between the electric potential of the first electrode and the SOC of the battery 5.

The processing circuit 21 calculates the relationship between the electric potential of the first electrode and the SOC of the battery 5 in the above-described way, thereby calculating the value of the electric potential of the first electrode corresponding to each of the plurality of SOC values. For example, the processing circuit 21 calculates the value of the electric potential of the first electrode corresponding to a state in which the SOC value of the battery 5 is 0 (a state in which the battery 5 has the lower limit voltage Vmin), and the value of the electric potential of the first electrode corresponding to a state in which the SOC value of the battery 5 is 1 (a state in which the battery 5 has the upper limit voltage Vmax). The processing circuit 21 then calculates the range between the value of the electric potential of the first electrode corresponding to the state in which the SOC value is 0 (0%) and the value of the electric potential of the first electrode corresponding to the state in which the SOC value is 1 (100%) as the electric potential range of the first electrode, which is usable in real time.

Also, in an example, the processing circuit 21 executes the state determination program 35, thereby calculating the relationship between the electric potential of the second electrode and the SOC of the battery 5 in real time based on the calculation result of the relationship between the electric potential of the first electrode and the SOC of the battery 5 in real time. At this time, an operation is performed using the measurement result of the voltage of the battery 5 for each of the plurality of SOC values including the target SOC values for which the second impedance is measured. Then, the corresponding value of the electric potential of the second electrode is calculated for each of the plurality of SOC values based on the measurement result of the voltage of the battery 5 and the calculation result of the electric potential of the first electrode.

The processing circuit 21 calculates the relationship between the electric potential of the second electrode and the SOC of the battery 5 in the above-described way, thereby calculating, for example, the value of the electric potential of the second electrode corresponding to a state in which the SOC value of the battery 5 is 0 (a state in which the battery 5 has the lower limit voltage Vmin) and the value of the electric potential of the second electrode corresponding to a state in which the SOC value of the battery 5 is 1 (a state in which the battery 5 has the upper limit voltage Vmax). The processing circuit 21 then calculates the range between the value of the electric potential of the second electrode corresponding to the state in which the SOC value is 0 (0%) and the value of the electric potential of the second electrode corresponding to the state in which the SOC value is 1 (100%) as the electric potential range of the second electrode, which is usable in real time.

The processing circuit 21 executes the state determination program 35, thereby performing determination concerning the state of the battery 5 based on at least one of the above-described relationship between the charge transfer resistance of the first electrode and the SOC of the battery 5, the reference SOC value with which the charge transfer resistance of the first electrode is minimized, the relationship between the electric potential of the first electrode and the SOC of the battery 5, and the relationship between the electric potential of the second electrode and the SOC of the battery 5. At this time, the degradation state of each of the first electrode and the second electrode and the degradation state of the entire battery 5 are determined.

Also, in an example, the processing circuit 21 executes the state determination program 35, thereby comparing data in the past with data in real time for each of the relationship between the charge transfer resistance of the first electrode and the SOC of the battery 5, the reference SOC value with which the charge transfer resistance of the first electrode is minimized, and the relationship between the electric potential of the first electrode and the SOC of the battery 5. The processing circuit 21 compares data in the past, which is data in a first period, with data in real time, which is data in a second period after the first period, thereby determining the state of the battery 5 in real time, including the degradation state of the first electrode in real time.

In this case, in each of the first period and the second period, the processing circuit 21 performs each of measurement of the first impedance for the plurality of SOC values, determination concerning whether the absolute value |β| of the change ratio β is equal to or smaller than the reference value βref, measurement of the second impedance for the target SOC values, and determination concerning the state of the battery 5. The data in the first period, which is the data in the past, is stored in the storage medium 22 or the like. In the determination concerning the state of the battery 5 in the second period, the processing circuit 21 reads out the data in the first period from the storage medium 22, and compares the data in the first period with the data in the second period, which is the data in real time.

For example, for each of the first period such as the start of use of the battery 5 and the second period after the first period, the processing circuit 21 calculates the relationship between the charge transfer resistance of the first electrode and the SOC of the battery 5 in the above-described way. Then, for each of the first period and the second period, the processing circuit 21 calculates the reference SOC value of the battery 5, with which the charge transfer resistance of the first electrode is minimized, in the above-described way. Concerning the reference SOC value of the battery 5, with which the charge transfer resistance of the first electrode is minimized, the processing circuit 21 compares the calculation result in the first period with the calculation result in the second period. Then, based on the comparison result for the reference SOC value, the processing circuit 21 calculates the change in the second period to the first period for the relationship between the SOC of the battery 5 and the electric potential of the first electrode.

Figure 10:
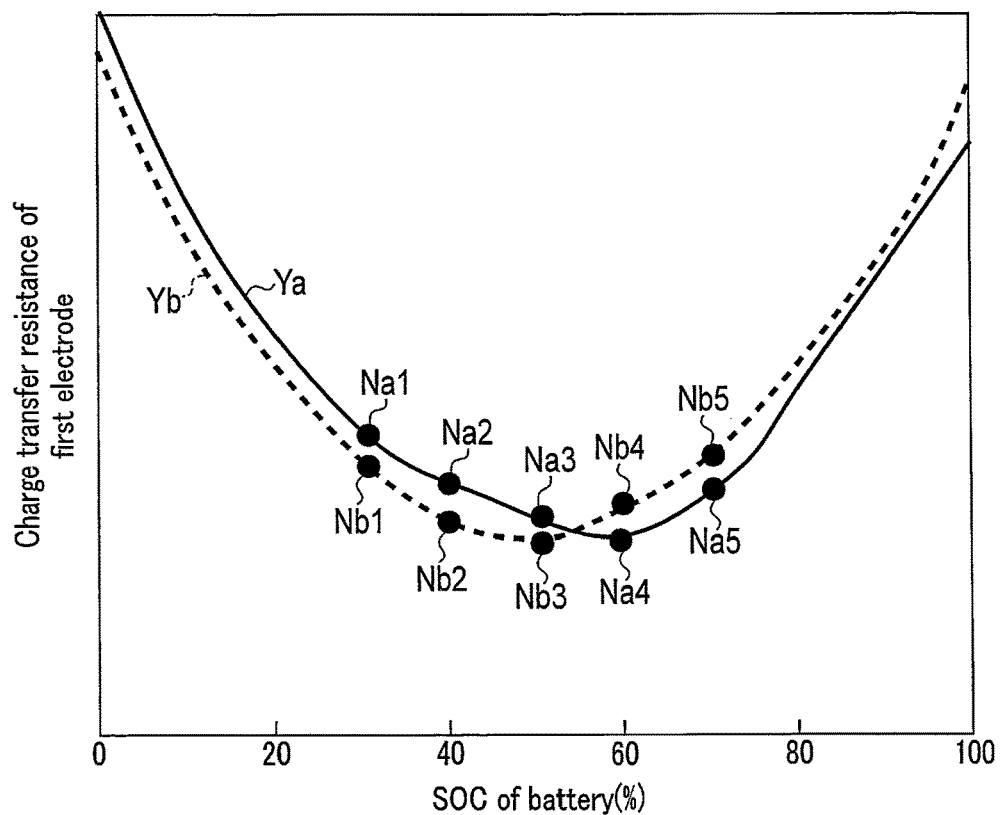
FIG. 10 is a schematic view showing an example of the relationship between the charge transfer resistance of the first electrode and the SOC of the battery in each of a first period and a second period after the first period, which is calculated in the embodiment.

FIG. 10 is a schematic view showing an example of the relationship between the charge transfer resistance of the first electrode and the SOC of the battery 5 in each of the first period and the second period after the first period, which is calculated in the embodiment. In FIG. 10, the abscissa represents the SOC of the battery 5, and the ordinate represents the charge transfer resistance of the first electrode. Also, in FIG. 10, the relationship in the first period is indicated by a solid line, and the relationship in the second period is indicated by a broken line. In the example shown in FIG. 10, in each of the first period and the second period, it is determined that in the plurality of SOC values for which the first impedance is measured, each of five SOC values of 0.3, 0.4, 0.5, 0.6, and 0.7 is the target SOC for which the absolute value $|\beta|$ of the above-described change ratio $\beta$ is equal to or smaller than the reference value $\beta$ref. Then, for each of the five target SOC values, the second impedance is measured, and the charge transfer resistance of the first electrode is calculated in the above-described way based on the measurement results of the first impedance and the second impedance.

In the example shown in FIG. 10, the calculation results of the charge transfer resistance of the first electrode for the five target SOC values in the first period are plotted as points Na1, Na2, Na3, Na4, and Na5, and the calculation results of the charge transfer resistance of the first electrode for the five target SOC values in the second period are plotted as points Nb1, Nb2, Nb3, Nb4, and Nb5. A locus Ya representing the relationship between the SOC of the battery 5 and the charge transfer resistance of the first electrode in the first period is calculated by a fitting calculation for fitting a function to the points Na1 to Na5, and a locus Yb representing the relationship between the SOC of the battery 5 and the charge transfer resistance of the first electrode in the second period is calculated by a fitting calculation for fitting a function to the points Nb1 to Nb5. In the example shown in FIG. 10, at the top of the projecting shape of the locus Ya, the SOC value is 0.6 (60%), and 0.6 is calculated as the reference SOC value with which the charge transfer resistance of the first electrode is minimized in the first period. Also, at the top of the projecting shape of the locus Yb, the SOC value is 0.5 (50%), and 0.5 is calculated as the reference SOC value with which the charge transfer resistance of the first electrode is minimized in the second period.

The reference SOC value with which the charge transfer resistance of the first electrode is minimized is calculated for each of the first period and the second period, as described above. Hence, in the example shown in FIG. 10, it is calculated that the reference SOC value is lower by about 10% (0.1) in the second period as compared to the first period. For this reason, it is calculated by the processing circuit 21 that in comparison under the same condition, the SOC value of the battery 5 is shifted by about 10% in SOC conversion of the battery 5 to the high electric potential side in the relationship between the electric potential of the first electrode and the SOC of the battery 5 in the second period as compared to that in the relationship between the electric potential of the first electrode and the SOC of the battery 5 in the first period. Hence, when data in a past period (first period) is compared with data in real time (second period) concerning the relationship between the charge transfer resistance of the first electrode and the SOC of the battery 5, the change from the past period is calculated concerning the relationship between the potential of the first electrode and the SOC of the battery 5.

Figure 11:
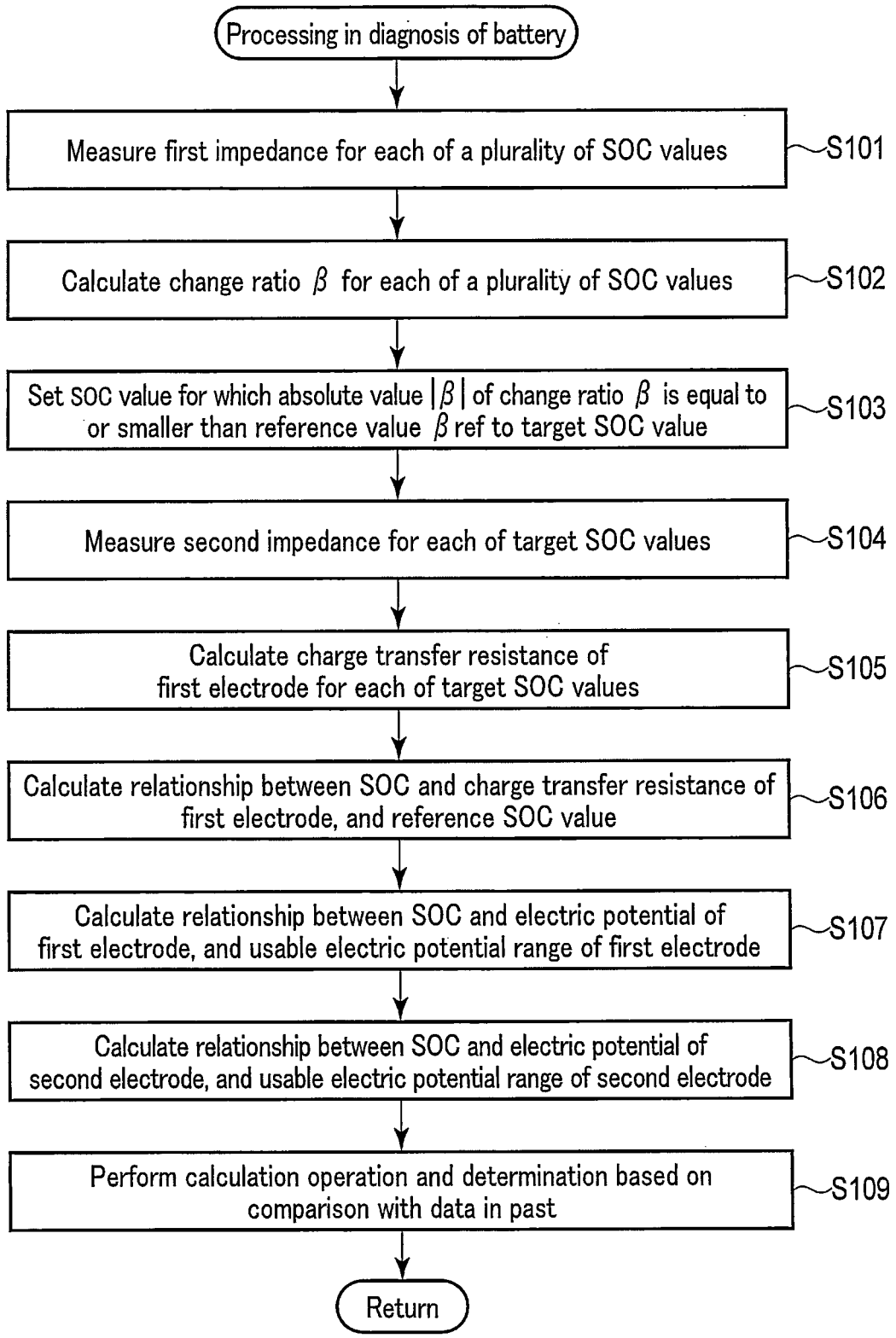
FIG. 11 is a flowchart schematically showing an example of processing performed by the processing circuit of a diagnosis apparatus executing a diagnosis program in the embodiment.

FIG. 11 is a flowchart schematically showing an example of processing performed by the processing circuit 21 of the diagnosis apparatus 3 executing the diagnosis program 28 in the embodiment. FIG. 11 shows processing in the diagnosis of the battery 5, and the processing shown in FIG. 11 is performed every time the battery 5 is diagnosed. When the processing shown in FIG. 11 is started, the processing circuit 21 measures, for each of a plurality of SOC value, the first impedance that is the impedance of the battery 5 at the first frequency in the above-described way (step S101). At this time, an AC current or the above-described superimposed current is input to the battery 5 at the first frequency, and the first impedance of the battery 5 is measured for each of the plurality of SOC values as the measurement target. For each of the plurality of SOC values for which the first impedance is measured, the processing circuit 21 calculates the change ratio $\beta$ of the first impedance to the SOC of the battery 5 in the above-described way (step S102).

The processing circuit 21 then sets, to the target SOC value, an SOC value for which the absolute value $|\beta|$ of the change ratio $\beta$ is equal to or smaller than the reference value $\beta$ref in the plurality of SOC values for which the first impedance is measured (step S103). At this time, the reference value $\beta$ref is set in the same way as any one of the above-described examples. In step S103, an SOC value that falls within the range of 30% (inclusive) to 70% (inclusive) in the plurality of SOC values may be determined as the target SOC value for which the absolute value $|\beta|$ of the change ratio $\beta$ is equal to or smaller than the reference value $\beta$ref. For each of SOC values set to the target SOC values, the processing circuit measures the second impedance that is the impedance of the battery 5 at the second frequency higher than the first frequency in addition to the first impedance (step S104). At this time, an AC current or the above-described superimposed current is input to the battery 5 at the second frequency, and the second impedance of the battery 5 is measured for each of the target SOC values.

Then, for each of the target SOC values, the processing circuit 21 calculates the charge transfer resistance of the first electrode as the resistance associated with the first electrode based on the first impedance and the second impedance (step S105). At this time, a fitting calculation is performed using an equivalent circuit model having the charge transfer resistance of the first electrode as an electric characteristic parameter, as described above, thereby calculating the charge transfer resistance of the first electrode for each of the target SOC values. Based on the calculation result of the charge transfer resistance of the first electrode for each of the target SOC values, the processing circuit 21 calculates, in the above-described way, the relationship between the charge transfer resistance of the first electrode and the SOC of the battery 5 in real time and the reference SOC value that is an SOC value with which the charge transfer resistance of the first electrode is minimized (step S106).

Then, based on the calculation result of the relationship between the charge transfer resistance of the first electrode and the SOC of the battery 5, the processing circuit 21 calculates, in the above-described way, the relationship between the SOC of the battery 5 and the electric potential of the first electrode in real time, and calculates the electric potential range of the first electrode, which is usable in real time (step S107). Based on the calculation result of the relationship between the SOC of the battery 5 and the electric potential of the first electrode and the measurement result of the voltage of the battery 5, the processing circuit 21 calculates, in the above-described way, the relationship between the SOC of the battery 5 and the electric potential of the second electrode in real time, and calculates the electric potential range of the second electrode, which is usable in real time (step S108).

For any one or more of the relationship between the charge transfer resistance of the first electrode and the SOC of the battery 5, the reference SOC value with which the charge transfer resistance of the first electrode is minimized, the relationship between the electric potential of the first electrode and the SOC of the battery and the relationship between the electric potential of the second electrode and the SOC of the battery 5, the processing circuit 21 compares data in the past (first period) with data in real time (second period). The processing circuit performs a calculation operation, determination of the state of the battery, and the like based on the comparison with the data in the past (step S109). At this time, for example, based on the reference SOC value with which the charge transfer resistance of the first electrode is minimized, as the change of the state of the battery 5 from a past period, the change from the past period is calculated, for example, for the relationship between the electric potential of the first electrode and the SOC of the battery 5.

As described above, in the embodiment, for each of the plurality of SOC values for which the first impedance is measured, it is determined whether the absolute value $|β|$ of the change ratio $β$ of the first impedance to the SOC of the battery 5 is equal to or smaller than the reference value $β$ref. For a target SOC value for which the absolute value $|β|$ of the change ratio $β$ is equal to or smaller than the reference value $β$ref in the plurality of SOC values, the second impedance is measured, and determination concerning the state of the battery 5 is performed based on the measurement results of the first impedance and the second impedance for the target SOC value. Since the frequency characteristic of the impedance is measured, as described above, the number of SOC values for which the second impedance as the impedance at the high frequency is to be measured decreases. When the number of SOC values as the measurement targets of the impedance at the high frequency decreases, an increase of the amount of data used to determine the state of the battery 5 is suppressed.

When the increase of the amount of data used to determine the state of the battery 5 is suppressed, an increase of the communication capacity between the battery mounting device 2 and the diagnosis apparatus 3 is also appropriately suppressed. Also, an increase of the amount of data to be processed by each of the control circuit 6 of the battery mounting device 2 and the processing circuit 21 of the diagnosis apparatus 3 is appropriately suppressed, and an increase of the load on the processor in each of the battery mounting device 2 and the diagnosis apparatus 3 is appropriately suppressed. In addition, an increase of the amount of data that need to be managed by the diagnosis apparatus 3 is appropriately suppressed. Furthermore, when the increase of the amount of data used to determine the state of the battery 5 is suppressed, time needed to analyze data is shortened, and time needed for processing in the diagnosis of the battery 5 is shortened.

Also, in the embodiment, for each of the plurality of SOC values, it is determined, based on the fact that the absolute value $|β|$ of the change ratio $β$ of the first impedance to the SOC is equal to or smaller than the reference value $β$ref, that the SOC value is the target SOC value as the measurement target of the second impedance. Since each target SOC value for which both the first impedance and the second impedance are measured is decided in the above-described way, the relationship between the SOC of the battery 5 and the charge transfer resistance of the first electrode and the reference SOC value with which the charge transfer resistance of the first electrode is minimized are appropriately calculated, as described above, based on the measurement results of the first impedance and the second impedance for each of the decided target SOC values. Then, the relationship between the electric potential of each of the first electrode and the second electrode and the SOC of the battery 5 is appropriately calculated based on the calculation result of the relationship between the SOC of the battery 5 and the charge transfer resistance of the first electrode.

Hence, in the embodiment, even if the number of SOC values for which the impedance at the high frequency is measured is decreased, the state of the battery 5 in real time, including the relationship between the SOC of the battery 5 and the charge transfer resistance of the first electrode, is appropriately determined based on the measurement result of the frequency characteristic of the impedance. That is, in the embodiment, an increase of the amount of data used to determine the state of the battery 5 is suppressed, and the state of the battery 5 is appropriately determined based on the measurement result of the frequency characteristic of the impedance.

Also, in an example of the embodiment, setting the half value of the absolute value $|βL|$ of the change ratio $βL$ for the lowest SOC value or the half value of the absolute value $|β|$ of the change ratio $βH$ for the highest SOC value to the reference value $β$ref, it is determined, for each of the plurality of SOC values, whether the absolute value $|β|$ of the change ratio $β$ is equal to or smaller than the reference value $β$ref. Hence, the second impedance is measured for a SOC value included in, for example, the SOC range in which the reference SOC value with which the charge transfer resistance of the first electrode is minimized can exist, such as the SOC range of 30% (inclusive) to 70% (inclusive).

Thus, based on the measurement results of the first impedance and the second impedance for each of the target SOC values, the relationship between the SOC of the battery 5 and the charge transfer resistance of the first electrode and the reference SOC value with which the charge transfer resistance of the first electrode is minimized are more appropriately calculated. Hence, concerning the state of the battery 5 including the relationship between the electric potential of the first electrode and the SOC of the battery 5, the change from a past period such as the start of use is more appropriately calculated based on the calculation result of the reference SOC value, and the like. Accordingly, the determination concerning the state of the battery 5 is more appropriately performed.

Verification Associated with Embodiment

In addition, the following verification was conducted as a verification associated with the above-described embodiment. In the verification, a diagnosis was made for a battery in which a positive electrode is a first electrode containing, as a positive electrode active material, lithium nickel cobalt manganese oxide that performs a single-phase reaction, and a negative electrode is a second electrode containing, as a negative electrode active material, lithium titanate that performs a two-phase coexistence reaction. Setting 0 (0%) to the lowest SOC value that is lowest and 1 (100%) to the highest SOC value that is highest, the frequency characteristic of the impedance of the battery was measured at an interval of 0.1 (10%) in SOC conversion of the battery. That is, the frequency characteristic of the impedance of the battery was measured for each of 11 SOC values. For each of the 11 SOC values, the impedance was measured at each of a plurality of frequencies different from each other, and the frequency characteristic of the impedance was measured.

Also, in the verification, for each of the 11 SOC values, the charge transfer resistance of the positive electrode that is the first electrode was calculated based on the measurement result of the frequency characteristic of the impedance. As described above in the embodiment, the charge transfer resistance of the positive electrode was calculated by performing a fitting calculation using an equivalent circuit model having the charge transfer resistance of the positive electrode as an electric characteristic parameter. Also, in the verification, on a graph with an abscissa representing the SOC of the battery and an ordinate representing the charge transfer resistance of the positive electrode, a point representing the charge transfer resistance of the positive electrode for each of the 11 SOC values was plotted. Using the plotted points, a curve that is a locus representing the relationship between the charge transfer resistance of the positive electrode and the SOC of the battery was calculated. The locus representing the relationship between the charge transfer resistance of the positive electrode and the SOC of the battery was calculated for each of three arithmetic patterns, that is, arithmetic patterns $\gamma 0$, $\gamma 1$, and $\gamma 2$.

Figure 12:
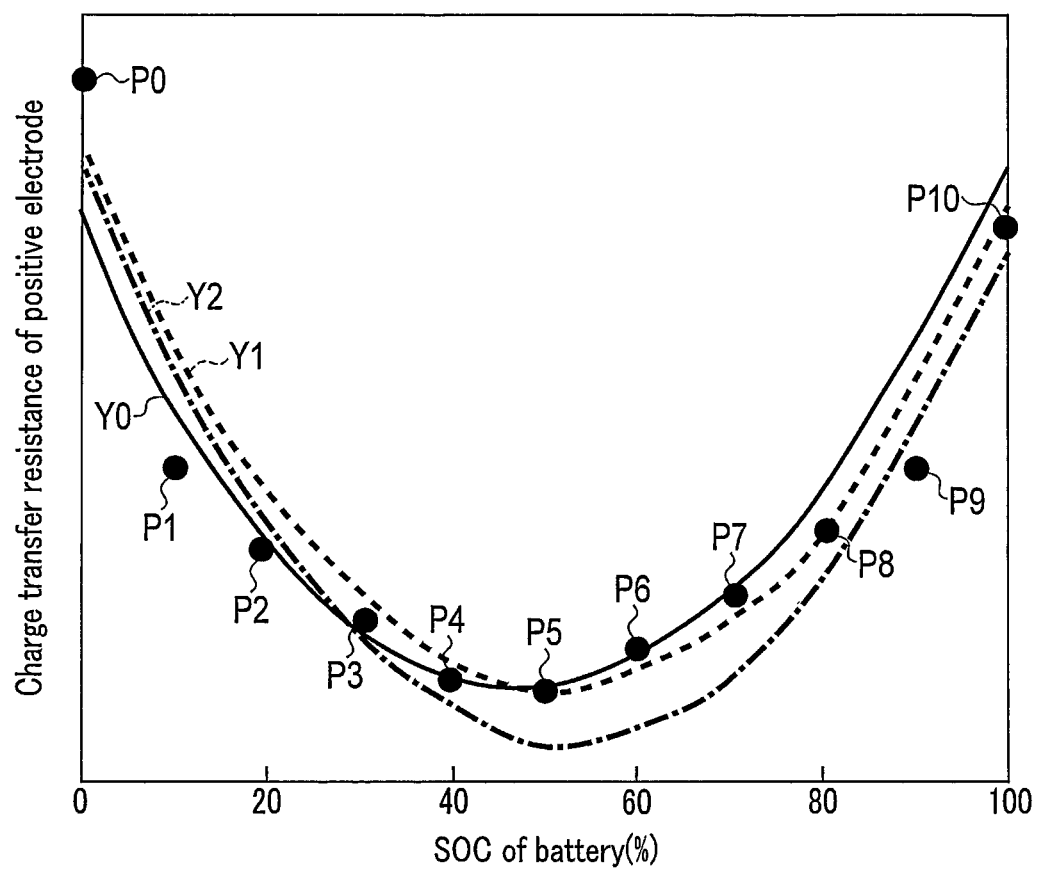
FIG. 12 is a schematic view for explaining three arithmetic patterns that calculate loci representing the relationship between the charge transfer resistance of a positive electrode and the SOC of the battery in a verification associated with the embodiment.

FIG. 12 is a schematic view for explaining the three arithmetic patterns $\gamma 0$ to $\gamma 2$ that calculate loci representing the relationship between the charge transfer resistance of the positive electrode and the SOC of the battery in the verification associated with the embodiment. In FIG. 12, the abscissa represents the SOC of the battery, and the ordinate represents the charge transfer resistance of the positive electrode. Also, in FIG. 12, for the 11 SOC values for which the frequency characteristic of the impedance was measured, the charge transfer resistances of the positive electrode are plotted as points P0, P1, P2, P3, P4, P5, P6, P7, P8, P9, and P10.

In the arithmetic pattern $\gamma 0$, using only the charge transfer resistances of the positive electrode for five SOC values within the range of 30% (inclusive) to 70% (inclusive) in the 11 SOC values, a locus representing the relationship between the charge transfer resistance of the positive electrode and the SOC of the battery was calculated. At this time, a curve Y0 as the locus representing the relationship between the charge transfer resistance of the positive electrode and the SOC of the battery was calculated by a fitting calculation for fitting a quadratic function to the five points P3 to P7. Hence, in the arithmetic pattern $\gamma 0$, the relationship between the charge transfer resistance of the positive electrode and the SOC of the battery was calculated using only the charge transfer resistances of the positive electrode for the SOC values within the range of 30% (inclusive) to 70% (inclusive), like an example of the above-described embodiment. Note that in FIG. 12, the curve Y0 is indicated by a solid line.

In the arithmetic pattern $\gamma 1$, using all the charge transfer resistances of the positive electrode for the 11 SOC values, unlike the above-described embodiment, a locus representing the relationship between the charge transfer resistance of the positive electrode and the SOC of the battery was calculated. At this time, a curve Y1 as the locus representing the relationship between the charge transfer resistance of the positive electrode and the SOC of the battery was calculated by a fitting calculation for fitting a quadratic function to the 11 points P0 to P10. In the arithmetic pattern $\gamma 2$, using only the charge transfer resistances of the positive electrode for six SOC values of 0, 0.2, 0.4, 0.6, 0.8, and 1 in the 11 SOC values, unlike the above-described embodiment, a locus representing the relationship between the charge transfer resistance of the positive electrode and the SOC of the battery was calculated. At this time, a curve Y2 as the locus representing the relationship between the charge transfer resistance of the positive electrode and the SOC of the battery was calculated by a fitting calculation for fitting a quadratic function to the six points P0, P2, P4, P6, P8, and P10. Note that in FIG. 12, the curve Y1 is indicated by a broken line, and the curve Y2 is indicated by a one-dot dashed line.

When the locus representing the relationship between the charge transfer resistance of the positive electrode and the SOC of the battery was calculated by each of the arithmetic patterns $\gamma 0$ to $\gamma 2$, as described above, in each of the arithmetic patterns $\gamma 0$ and $\gamma 2$, the amount of data used to calculate the relationship between the charge transfer resistance of the positive electrode and the SOC of the battery was reduced as compared to the arithmetic pattern $\gamma 1$. Also, on the curve Y0 calculated as the locus by the arithmetic pattern $\gamma 0$, within the SOC range in which the reference SOC value with which the charge transfer resistance of the positive electrode was minimized could exist, that is, the SOC range of 30% (inclusive) to 70% (inclusive), a deviation to the curve Y1 calculated by the arithmetic pattern $\gamma 1$ was smaller as compared to the curve Y2 calculated by the arithmetic pattern $\gamma 2$. That is, in the arithmetic patterns $\gamma 0$ and $\gamma 2$, the amount of data used to calculate the relationship between the charge transfer resistance of the positive electrode and the SOC of the battery was reduced as compared to the arithmetic pattern $\gamma 1$. However, within the SOC range of 30% (inclusive) to 70% (inclusive), the curve Y0 calculated by the arithmetic pattern $\gamma 0$ had values close to the curve Y1 calculated by the arithmetic pattern $\gamma 1$ as compared to the curve Y2 calculated by the arithmetic pattern $\gamma 2$.

The verification above demonstrated that even if the second impedance was measured only for target SOC values for which the absolute value $|\beta|$ of the change ratio $\beta$ of the first impedance was equal to or smaller than the reference value $\beta ref$, and only the charge transfer resistances of the first electrode for the target SOC values were used, as in the embodiment, the reference SOC value with which the charge transfer resistance of the first electrode was minimized, and the relationship between the charge transfer resistance of the first electrode and the SOC of the battery were appropriately calculated. Hence, it was demonstrated that when the first impedance and the second impedance were measured only for the target SOC values for which the absolute value $|\beta|$ of the change ratio $\beta$ of the first impedance was equal to or smaller than the reference value $\beta ref$, and the state of the battery was determined using the measurement results of the first impedance and the second impedance for each target SOC value, suppression of the increase of the amount of data used to determine the state of the battery and improvement of the accuracy in determining the state of the battery were simultaneously implemented.

In at least one embodiment or example described above, it is determined, for each of a plurality of SOC values for which the first impedance is measured, whether the absolute value of the change ratio of the first impedance to the SOC is equal to or smaller than the reference value. Then, the second impedance is measured for each target SOC value for which the absolute value of the change ratio is equal to or smaller than the reference value, and determination concerning the state of the battery is performed based on the measurement results of the first impedance and the second impedance for the target SOC value. It is therefore possible to provide a diagnosis method, a diagnosis apparatus, and a diagnosis system of a battery, and a non-transitory storage medium, which are configured to suppress an increase of the amount of data used to determine the state of the battery and appropriately determine the state of the battery based on the measurement result of the frequency characteristic of the impedance.

Note that, for example, the terms "or less" and "or more" used to express the range of SOC values or frequencies can appropriately be replaced with terms "less than", "smaller than", and "larger than".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A diagnosis method of a battery, comprising:
   determining, based on a measurement result of a first impedance that is an impedance of the battery at a first frequency, whether an absolute value of a change ratio of the first impedance to an SOC of the battery is not more than a reference value, for each of a plurality of SOC values of the battery;
   measuring, for a target SOC value for which the absolute value of the change ratio is not more than the reference value in the plurality of SOC values, a second impedance that is the impedance of the battery at a second frequency higher than the first frequency in addition to the first impedance; and
   performing determination concerning a state of the battery based on measurement results of the first impedance and the second impedance for the target SOC value.

2. The diagnosis method according to claim 1, wherein in the determining whether the absolute value of the change ratio is not more than the reference value, setting one of a half value of the absolute value of the change ratio for a lowest SOC value that is lowest in the plurality of SOC values and a half value of the absolute value of the change ratio for a highest SOC value that is highest in the plurality of SOC values to the reference value, the determination is performed for each of the plurality of SOC values.

3. The diagnosis method according to claim 1, wherein in the determining whether the absolute value of the change ratio is not more than the reference value, an SOC value that falls within a range of 30% to 70% in the plurality of SOC values is determined as the target SOC value for which the absolute value is not more than the reference value.

4. The diagnosis method according to claim 1, wherein in the performing the determination concerning the state of the battery, for the target SOC value for which the absolute value is not more than the reference value, a resistance associated with a first electrode that is one of a positive electrode and a negative electrode is calculated based on the measurement results of the first impedance and the second impedance.

5. The diagnosis method according to claim 4, wherein in the determining whether the absolute value of the change ratio is not more than the reference value, at least two of the plurality of SOC values are determined as the target SOC values for which the absolute value is not more than the reference value, and
in the performing the determination concerning the state of the battery, for each of the at least two target SOC values, the resistance associated with the first electrode is calculated, and a relationship between the resistance associated with the first electrode and the SOC of the battery is calculated.

6. The diagnosis method according to claim 5, wherein in the performing the determination concerning the state of the battery, an SOC value with which the resistance associated with the first electrode is minimized is calculated as a reference SOC value based on the relationship between the resistance associated with the first electrode and the SOC of the battery.

7. The diagnosis method according to claim 6, wherein each of the determining whether the absolute value of the change ratio is not more than the reference value, the measuring the second impedance for the target SOC value, and the performing the determination concerning the state of the battery is performed in each of a first period and a second period after the first period, and
in the performing the determination concerning the state of the battery in the second period, the reference SOC value with which the resistance associated with the first electrode is minimized is compared between the first period and the second period, thereby determining a degradation state of the first electrode.

8. The diagnosis method according to claim 5, wherein in the performing the determination concerning the state of the battery, a relationship between an electric potential of the first electrode and the SOC of the battery is calculated based on the relationship between the resistance associated with the first electrode and the SOC of the battery, and a usable electric potential range of the first electrode is calculated based on the relationship between the electric potential of the first electrode and the SOC of the battery.

9. The diagnosis method according to claim 8, wherein in the performing the determination concerning the state of the battery, based on the relationship between the electric potential of the first electrode and the SOC of the battery, a relationship between an electric potential of a second electrode that is one of the positive electrode and the negative electrode, which has a polarity opposite to that of the first electrode, and the SOC of the battery is calculated, and a usable electric potential range of the second electrode is calculated.

10. The diagnosis method according to claim 1, further comprising inputting, to the battery, a superimposed current generated by superimposing a current waveform of an AC current on a reference current locus of a DC current at the first frequency, thereby measuring the first impedance for each of the plurality of SOC values,
wherein in the measuring the second impedance, a superimposed current generated by superimposing the current waveform of the AC current on the reference current locus at the second frequency is input to the battery, thereby measuring the second impedance for the target SOC value.

11. A diagnosis apparatus comprising
a processor configured to:
determine, based on a measurement result of a first impedance that is an impedance of the battery at a first frequency, whether an absolute value of a change ratio of the first impedance to an SOC of the battery is not more than a reference value, for each of a plurality of SOC values of the battery;

measure, for a target SOC value for which the absolute value of the change ratio is not more than the reference value in the plurality of SOC values, a second impedance that is the impedance of the battery at a second frequency higher than the first frequency in addition to the first impedance; and perform determination concerning a state of the battery based on measurement results of the first impedance and the second impedance for the target SOC value.

12. A diagnosis system of a battery, comprising:
a diagnosis apparatus according to claim 11; and
the battery diagnosed by the diagnosis apparatus.

13. The diagnosis system according to claim 12, wherein
the battery includes a first electrode that is one of a positive electrode and a negative electrode, and a second electrode that is one of the positive electrode and the negative electrode, which has a polarity opposite to that of the first electrode,
the first electrode includes a first electrode active material that performs a single-phase reaction, and
the second electrode includes a second electrode active material that performs a two-phase coexistence reaction.

14. A non-transitory storage medium storing a diagnosis program of the battery, the diagnosis program causing a computer to:

determine, based on a measurement result of a first impedance that is an impedance of the battery at a first frequency, whether an absolute value of a change ratio of the first impedance to an SOC of the battery is not more than a reference value, for each of a plurality of SOC values of the battery;

measure, for a target SOC value for which the absolute value of the change ratio is not more than the reference value in the plurality of SOC values, a second impedance that is the impedance of the battery at a second frequency higher than the first frequency in addition to the first impedance; and perform determination concerning a state of the battery based on measurement results of the first impedance and the second impedance for the target SOC value.

* * * * *